(12) United States Patent
Toeda et al.

(10) Patent No.: US 6,661,076 B2
(45) Date of Patent: Dec. 9, 2003

(54) SEMICONDUCTOR DEVICE

(75) Inventors: Masahiro Toeda, Tokyo (JP);
Kazunari Takasugi, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/984,442

(22) Filed: Oct. 30, 2001

(65) Prior Publication Data

US 2002/0063304 A1 May 30, 2002

(30) Foreign Application Priority Data

Nov. 29, 2000 (JP) ........................................ 2000/363055

(51) Int. Cl.⁷ .................... H01L 27/12; H01L 31/119; H01L 29/00; H01L 23/29
(52) U.S. Cl. ..................... 257/507; 257/347; 257/513; 257/515; 257/501; 257/368; 257/524; 257/787; 257/791
(58) Field of Search ................. 257/347, 513, 257/515, 501, 507, 368, 524, 787, 791

(56) References Cited

U.S. PATENT DOCUMENTS

| | | | |
|---|---|---|---|
| 5,525,533 A | * | 6/1996 | Woodruff et al. ............. 437/60 |
| 5,751,022 A | * | 5/1998 | Yasuhara et al. ............ 257/133 |
| 6,040,600 A | * | 3/2000 | Uenishi et al. .............. 257/330 |
| 6,225,664 B1 | * | 5/2001 | Endo et al. ................. 257/347 |
| 6,274,452 B1 | * | 8/2001 | Miura et al. ................ 438/384 |

FOREIGN PATENT DOCUMENTS

| | | | |
|---|---|---|---|
| JP | 1-261850 | * | 10/1989 |
| JP | 4-3466 | * | 1/1992 |
| JP | 06-177242 A | | 6/1994 |
| JP | 6-244239 | | 9/1994 |
| JP | 2654268 | | 5/1997 |
| JP | 2770657 | | 4/1998 |
| JP | 11-317526 A | | 11/1999 |
| JP | 11-354631 | | 12/1999 |
| JP | 3061020 | | 4/2000 |
| JP | 2000-156408 | | 6/2000 |
| JP | 2000-223665 | * | 8/2000 |
| JP | 2000223665 | * | 8/2000 |

* cited by examiner

Primary Examiner—Jerome Jackson
Assistant Examiner—Joseph Nguyen
(74) Attorney, Agent, or Firm—Sughrue Mion, PLLC

(57) ABSTRACT

A semiconductor device in which the potential of a conductive support substrate can be kept to be a predetermined potential, while an SOI substrate is used as a chip substrate, without adding a new step and providing a rear electrode, is provided. In a chip, on the main surface of a first Si substrate of a P-type, a $SiO_2$ film and a second Si substrate of a P-type are laminated in this order. The chip has, in the second Si substrate, isolation trenches, an outermost isolation trench, a plurality of element forming regions isolated by these trenches, second element forming regions, a peripheral region, and a peripheral region connection wiring which connects a contact region of the peripheral region with a contact region connected with a predetermined potential, for example, a ground potential in the second element forming region surrounded by, for example, the isolation trench.

6 Claims, 17 Drawing Sheets

SEMICONDUCTOR DEVICE

BACKGROUND OF THE INVENTION

1. Field of the Invention

The present invention generally relates to a semiconductor device having a SOI (silicon on insulator) substrate including a semiconductor layer, on which a desired element is formed, disposed on an insulating layer which is disposed on a conductive support substrate. More specifically, the present invention relates to a semiconductor device which is a thin type, has a high breakdown voltage, and is effectively applied to a flat type display device such as a plasma display device (hereinafter referred to as a PDP device) or an electroluminescence display device (hereinafter referred to as an EL device). The present application is based on Japanese Patent Application No. 363055/2000, which is incorporated herein by reference.

2. Description of the Related Art

With respect to a flat type display device such as the PDP device or the EL device, in order to realize miniaturization, thinness, reduce power consumption or the like, a high breakdown voltage semiconductor device is used in many cases. In particular, in the case of reduced consumption power by utilizing components having low consumption power including a semiconductor device to be used, in order to suppress the consumption of reactive power by charging and discharging a large stray capacitor necessarily included in the semiconductor device structure, a power recovery circuit is provided to reduce the consumption power of the display device.

FIGS. 1A and 1B show explanatory views of a low power driver device in a plasma display described in Japanese Patent No. 2770657. With reference to FIG. 1A, a low power driver device (power recovery circuit) 600 includes a capacitor CR having a sufficiently larger capacitance than a load capacitor CL, a p-channel type field effect transistor (hereinafter referred to as a pMOS) 611 and a diode D1, which function as a switch for charging CL from CR, an n-channel type field effect transistor (hereinafter referred to as an nMOS) 621 and a diode D2, which function as a switch for discharging CL, an inductor L1 which forms a resonant circuit together with CL at charge and discharge and recovers reactive power, a pMOS 612 to maintain an output at a voltage V0, and an nMOS 622 to maintain an output at a ground potential. The load capacitor CL is a parasitic capacitor such as a counter capacitor or a line capacitor, which is present in the plasma display. If a drive frequency is given by f0, power of $f0 \times CL \times V0^2$ is generally wasted.

The low power driver device 600 is for recovering the wasted reactive power and operates as follows. When the output rises as shown in FIG. 1B, the pMOS 611 is turned on to form an equivalent circuit as shown in FIG. 2. The output rises to V0 by the resonant circuit composed of L1 and CL and at the moment, the pMOS 612 is turned on and thus the output is maintained at V0. On the other hand, when the output falls, the nMOS 621 is turned on to construct a resonant circuit as shown in FIG. 2. Thus, the output falls to 0 V. Also, the nMOS 622 is turned on and thus the output is maintained at 0 V. Such a series of operations is the operation of the resonant circuit and energy for charging CL is again recovered by CR. In addition, by this operation, a potential of CR is automatically maintained at V0/2.

When the low power driver device 600 is applied to the PDP device, for example, as shown in FIG. 3, an output terminal 601 is connected with a high voltage portion common power source terminal 501 of a driver IC 500 such as a scan driver circuit in the plasma display panel. The driver IC 500 supplies a high voltage V0 inputted from the high voltage portion common power source terminal 501 from output terminals 506a to 506x to predetermined electrodes in the plasma display panel through a selection portion 510. Reference symbol CL denotes a capacitor in the case where it is viewed from the output terminals 506a to 506x. The selection portion 510 is composed of a plurality of CMOS switch portions 511 to 51x. For example, the CMOS switch portion 511 connects a high voltage common wiring connected with the high voltage portion common power source terminal 501 with a ground by a serial connector made from the source drain path of a pMOS 511P and the source drain path of an nMOS 511N, and also connects a common connection point N21 with the output terminal 506a. Although the descriptions are omitted here, the other CMOS switch portions 512 to 51x have the same structure. Hereinafter, the CMOS switch portion 511 will be described as an example. With such a structure, at power recovery operation for recovering charges discharged from the load capacitor CL, the charges are recovered by the capacitor CR through the output terminal 506a, the common connection point N21, and the pMOS 511P in the driver IC 500. With this structure, when the driver IC is formed on a general silicon substrate with a self-isolation structure, an element cross sectional structure as shown in FIG. 4A is obtained (equivalent circuit is shown in FIG. 4B). Thus, a leak current Ir is produced through a P-type substrate 830 and an N-well parasitic bipolar transistor 891, which causes a reduction in power recovery efficiency. On the P-type substrate 830, P-type diffusion layers 836 and 832, N-type diffusion layers 831 and 833, and insulating layers 842 are formed. On the other hand, when it is formed on an SOI substrate with a trench isolation structure, an element cross sectional structure as shown in FIG. 5A is obtained (equivalent circuit is shown in FIG. 5B). Thus, there is an advantage in which all charges discharged from the load capacitor CL can be recovered by the capacitor CR. Therefore, in a high breakdown voltage semiconductor device including a display device driver IC, the SOI substrate is used as a chip substrate in many cases. On a silicon substrate 301, an insulating layer 302, and a semiconductor layer having P-type diffusion layers 353, N-type diffusion layers 356 and isolation trenches 315 are formed.

In addition to realizing lower consumption power of the display device, in order to progress miniaturization and decrease in thickness thereof, miniaturization and decrease in thickness of a semiconductor device to be used in large quantity as a driver circuit is essential. Also, with the driver circuit, mounting to a thin type package such as a TCP (tape carrier package) and coping with a bare chip assembly such as a flip chip assembly and are desirable. In mounting to the thin type package, the flip chip assembly, or the like, for example, as shown in FIGS. 16A and 16B, generally, a rear surface 806 (surface on which an element is not formed) of a semiconductor chip 800 is not connected with another conductor such as an island and thus becomes a floating state. Thus, when the SOI substrate is used as a chip substrate, generally, a conductive support substrate becomes a floating state. Therefore, if a conductive support substrate 801 becomes a floating state in the chip 800 using the SOI substrate as the chip substrate, the potential of the conductive support substrate 801 becomes unstable. Also, as disclosed in, for example, Japanese Patent No. 2654268 or Japanese Patent No. 3061020, an inverse breakdown voltage of a p-n junction formed in a semiconductor layer 803 on the SOI substrate is changed dependent on the potential of the conductive support substrate 801. Thus, if the conductive support substrate 801 becomes a floating state and its potential cannot be maintained at a suitable value, a problem such as the inverse breakdown voltage is greatly decreased is caused. Thus, the chip using the SOI substrate has been mounted on a package having an island such as a general lead frame. However, mounting the chip using the SOI substrate to the package including the TCP and an applying the chip using the same to the flip chip assembly, in which the rear surface of the chip in which an element is not formed becomes a floating state and thus the potential of the rear surface cannot be maintained, cannot be made.

As one method for solving this problem, a semiconductor device having a structure such as a predetermined potential can be provided from the side of the semiconductor layer in which an element is formed to the conductive support substrate even in the case where the SOI substrate is used as the chip substrate, is disclosed in Japanese Patent Application Laid-open No. Hei. 6-244239, Japanese Patent Application Laid-open No. Hei. 11-354631, or Japanese Patent Application Laid-open No. 2000-156408.

FIG. 6 is a partially cross sectional view enlarging a main portion (vicinity of a scribing end surface 1611) in the case where the flip chip assembly is made for the semiconductor device disclosed in Japanese Patent Application Laid-open No. Hei. 6-244239. With reference to FIG. 6, a semiconductor layer 1603 of the semiconductor device is insulated from a semiconductor substrate 1601 by an intermediate insulating film 1602. However, a short circuit conductor 1610 provided on the side surface of a concave portion 1609 that reaches the semiconductor substrate 1601 is short-circuited with the semiconductor substrate 1601 and a peripheral region portion 1603b. Thus, the semiconductor substrate 1601 is provided with the same potential as the peripheral region portion 1603b. The peripheral region portion 1603b is provided with a potential from a wiring substrate 1608 through, for example, a bump 1607 equal to an element forming region portion. That is, the potential can be provided from the front surface side of the semiconductor layer 1603 in which an element is formed to the semiconductor substrate 1601. A silicon oxide film 1612, a silicon nitride film 1613, an aluminum electrode 1614, a ground potential line 1615, an opening for a bump 1607 are formed as shown in FIG. 6.

FIG. 7 is a main portion cross sectional view of the semiconductor device disclosed in the Japanese Patent Application Laid-open No. Hei. 11-354631. With reference to FIG. 7, this semiconductor device is composed of an SOI substrate with which an N$^-$-type semiconductor layer 1742 is provided through a silicon oxide film 1743 on an N-type Si semiconductor support substrate 1741 including an N$^+$-type semiconductor layer 1741b disposed on the surface layer of a silicon substrate 1741a. With respect to an element forming region 1730 of the semiconductor layer 1742, in which a high breakdown voltage MOSFET element is formed, an N$^+$-type semiconductor region 1744 is provided in the surface layer and a P-type semiconductor region 1745 is provided at a depth to the silicon oxide film 1743 so as to circularly surround the N$^+$-type semiconductor region 1744 at a predetermined distance. In the surface layer of the P-type semiconductor layer 1745, an N$^+$-type semiconductor region 1753 is provided in a position at a predetermined distance as a channel length from a PN junction between the semiconductor layer 1742 and the P-type semiconductor region 1745 and a P$^+$-type semiconductor region 1754 is provided adjacent to the N$^+$-type semiconductor region 1753. A drain electrode 1746 is provided for the N$^+$-type semiconductor region 1744 with ohmic contact. Also, a source electrode 1747 is provided for the N$^+$-type semiconductor region 1753 and the P$^+$-type semiconductor region 1754 with ohmic contact. An isolation layer 1749 that reaches the silicon oxide film 1743 and isolates the semiconductor layer 1742 into a plurality of regions is provided on the semiconductor layer 1742. An element forming region 1730 is surrounded by the isolation layer 1749. A conductive layer 1752 which reaches the semiconductor support substrate 1741 through the silicon oxide film 1743 and is made of N$^+$-type polysilicon, is provided in a substrate potential lead region 1740 of the semiconductor layer 1742 isolated from the element forming region 1730. Note that, when the surface layer of the semiconductor support substrate 1741 is a P$^+$-type, a conductive layer made of P$^+$-type polysilicon is provided. A substrate potential keeping electrode 1748 is connected on a conductive layer 1752. Although not shown, the substrate potential keeping electrode 1748 is connected therewith at the same potential as the source electrode 1747. An insulating film 1751 is provided in the surface of the semiconductor layer 1742 except for positions in which the drain electrode 1746, the source electrode 1747, and the substrate potential keeping electrode 1748 are connected. A gate electrode 1756 is provided in the insulating film 1751 in a position between the semiconductor layer 1742 and the N$^+$-type semiconductor region 1753 on the P-type semiconductor layer 1745 through a gate oxide film 1755 included in the insulating film 1751.

The operation of the N-channel high breakdown voltage MOSFET in the semiconductor device having the above structure is as follows. When the source electrode 1747 and the substrate potential keeping electrode 1748 is kept to be 0 V and then a positive voltage is applied to the drain electrode 1746 while the gate electrode 1756 is in an off control state, a depletion layer is extended from the PN junction between the semiconductor layer 1742 and the P-type semiconductor region 1745 to the side of the semiconductor layer 1742. At this time, the entire semiconductor support substrate 1741 becomes 0 V from the substrate potential keeping electrode 1748 through the conductive layer 1752 and functions as a field plate through the silicon oxide film 1743. Thus, in addition to the above depletion layer, a depletion layer is extended in the direction from the interface between the semiconductor layer 1742 and the silicon oxide film 1743 toward the surface of the semiconductor layer 1742. Therefore, the former depletion is easy to extend by this influence and an electric field in the PN junction between the semiconductor layer 1742 and the P-type semiconductor region 1745 is relaxed.

As described above, the potential of the semiconductor support substrate 1741 as the SOI substrate is maintained at the potential of the source electrode 1747 through the substrate potential keeping electrode 1748 provided in the surface. Thus, with respect to the chip using the SOI substrate as the chip substrate, without providing the rear surface of the SOI substrate with the electrode, mounting of the high breakdown voltage MOSFET element is allowed utilizing a surface electric field relaxation effect in the element forming region 1730 in which the MOSFET element is formed. And, (1) mounting of a semiconductor device chip having the high breakdown voltage MOSFET on a BGA (ball grid array) as a surface mount type IC package or a CSP (chip size package) is allowed and (2) use of an insulating paste for reducing a die bonding cost is allowed in the case where the chip is connected by wire bonding or die bonding.

FIG. 8 is a cross sectional structure view of the semiconductor device disclosed in Japanese Patent Application Laid-open No. 2000-156408. With reference to FIG. 8, in this semiconductor device, a first insulating oxide film 1802 is formed on a semiconductor support substrate 1801 made of P-type silicon, an SOI layer 1803 made of P-type silicon is provided on the first insulating oxide film 1802, and semiconductor elements not shown are formed in the SOI layer 1803.

Also, a hole 1804 which penetrates the SOI layer 1803 and the first insulating oxide film 1802 and reaches the surface of the semiconductor support substrate 1801 is formed in a predetermined position. The side surface and the bottom surface of the hole 1804 are filled with a second insulating oxide film 1806 to form an element isolation region, and thus the semiconductor elements formed on the SOI layer 1803 are electrically isolated. Further, a hole 1805 that penetrates the SOI layer 1803 and the first insulating oxide film 1802 and reaches the surface of the semiconductor support substrate 1801 is formed in a predetermined position. The side surface and the bottom surface of the hole 1805 are filled with P-type polysilicon to form a conductor layer 1807 for providing the semiconductor support substrate 1801 with a potential.

A third insulating oxide film 1808 in which a hole 1809 reaching the conductor layer 1807 is formed is deposited on the SOI layer 1803. Further, a wiring aluminum electrode 1810 is formed on the third insulating oxide film 1808. The electrode 1810 simultaneously fills the hole 1809 and electrically connects with the conductor layer 1807. By such a structure, a predetermined potential can be provided from the electrode 1810 formed in the surface to the semiconductor support substrate 1801.

In Japanese Patent Application Laid-open No. Hei. 6-244239 and Japanese Patent Application Laid-open No. Hei. 11-345631, a potential can be provided from the surface of the semiconductor layer forming an element in the SOI substrate to the conductive support substrate and the potential of the conductive support substrate can be kept without providing the rear surface of the chip with the electrode. However, there is a problem in which the structure is complicated and the addition of a step is required. For example, Japanese Patent Application Laid-open No. Hei. 6-244239, in order to provide a potential from the surface of the semiconductor layer to the conductive support substrate, it is necessary to add at least a step of removing the semiconductor layer of the scribe region and the intermediate insulating layer for insulating the semiconductor layer from the conductive support substrate to form an concave trench and a step of depositing aluminum to form a short circuit conductor in the side walls of the concave trench. Also, in Japanese Patent Application Laid-open No. Hei. 11-345631 and Japanese Patent Application Laid-open No. 2000-156408, it is necessary to add a step of providing a connection hole which penetrates the insulating layer from the surface of the semiconductor layer forming an element in the SOI substrate and reaches the conductive support substrate and a step of filling the connection hole with polycrystalline silicon. Note that the connection hole and the element isolation trench can be simultaneously formed. However, in this case, a filling material for the connection hole is different from that for the element isolation trench. Thus, although the detail description is omitted here, it is necessary to add another step and degrees in the addition of the step are not greatly different.

An illustrative, non-limiting embodiment of the present invention provides a semiconductor device in which the potential of the conductive support substrate can be kept to be a predetermined potential while the SOI substrate is used as the chip substrate, without adding a new step and providing a rear electrode. Thus, the thinness of the high breakdown voltage semiconductor device and the support to the flip chip assembly are allowed and the improvement of power recovery efficiency of the flat type display device can be compatible with the miniaturization and the thinness of the display device.

SUMMARY OF THE INVENTION

The present invention is based on the following findings from various experiments during the development progress of the above thin type and high breakdown voltage semiconductor device, but is not limited thereto. That is, even in the case where the SOI substrate is used as the chip substrate, when the chips are separated into individual items by dicing, an electrical continuity path is caused in an insulating layer of the side end surface of the chip, and thus a current path is formed between the peripheral portion of a semiconductor layer and a conductive support substrate. When at least the peripheral portion of the semiconductor layer and the conductive support substrate are set to be the same conductivity type, even if the rear surface of the conductive support substrate is not connected with another conductive material, the conductive support substrate can be set to be the same potential as the peripheral region of the semiconductor layer. The present invention is adapted to solve the above problems based on the findings.

Thus, one illustrative, non-limiting embodiment of a semiconductor device of the present invention has a chip in which a desired element is formed in a semiconductor layer of an SOI (silicon on insulator) substrate having a structure in which the semiconductor layer is laminated on a conductive support substrate through an insulating layer, and is characterized in that, the chip includes, in the semiconductor layer, a plurality of isolation trenches filled with an insulating material and reaching to the insulating layer, and a plurality of element forming regions in which the desired element is formed by surrounding its periphery by the isolation trenches, and the chip further includes a peripheral region connection wiring for connecting a contact region provided in a predetermined position of a peripheral region, which is not surrounded by any one of the isolation trenches, with an electrode having a predetermined potential within at least one of the element forming regions.

In this case, one of the isolation trenches may be an outermost isolation trench that surrounds all the element forming regions. Also, the chip can further include a second element forming region in which the desired element is formed by surrounding its periphery by at least double of the isolation trenches.

Also, when the chip includes a low voltage operation circuit which operates with a power source voltage of, for example, 10 V or lower, and a high voltage operation circuit which operates with 20 V or higher, it is desirable that an element composing at least the high voltage operation circuit is formed within the second element forming region.

Also, the chip can include a driver circuit portion of a display device and further include a recovery electrode, which is connected at least with the driver circuit portion in the chip and a power recovery circuit. Also, the display device can be selected from a plurality of flat type display devices including a plasma display device and an electroluminescence display device.

Also, when the conductive support substrate is one conductivity type semiconductor substrate, it is desirable that the semiconductor layer that becomes at least the peripheral region of the chip, has one conductivity type.

Also, when the chip is mounted into a package and assembled, it may be made with a state so that a rear surface of the chip, in which the conductive support substrate is exposed, is not brought into contact with another conductive material including an island in which the chip is mounted.

Also, one illustrative, non-limiting embodiment of a method of manufacturing the semiconductor device includes: a first step of preparing an SOI wafer in which one conductivity type semiconductor layer is formed on one conductivity type semiconductor substrate through an insulating layer; a second step of opening an isolation trench that reaches the insulating layer in the one conductivity type semiconductor layer, and filling the isolation trench with a predetermined insulating material to divide a plurality of element forming regions, and forming an outermost isolation trench surrounding all the element forming regions in the same chip; a third step of forming a desired element in the plurality of element forming regions divided by the isolation trench; a fourth step of, in each of a plurality of chips arranged in an alignment state on the wafer through a scribe region, forming a chip interconnection wiring including a peripheral region connection wiring connected with an electrode having a predetermined potential in the element forming region through a contact hole provided in a predetermined position of a peripheral region outside the outermost isolation trench; and a fifth step of dicing the scribe region to separate the plurality of chips into individual items.

BRIEF DESCRIPTION OF THE DRAWINGS

Features of the illustrative, non-limiting embodiments of the present invention will be more apparent from the following description taken in conjunction with the accompanying drawings, in which.

DETAILED DESCRIPTION OF THE EMBODIMENTS

The following description of the embodiments discloses specific configurations, features, and operations. However, the embodiments are merely examples of the present invention, and thus, the specific features described below are merely used to more easily describe such embodiments and to provide an overall understanding of the present invention. Accordingly, one skilled in the art will readily recognize that the present invention is not limited to the specific embodiments described below. Furthermore, the descriptions of various configurations, features, and operations of the present invention that would have been known to one skilled in the art are omitted for the sake of clarity and brevity.

Figure 9:
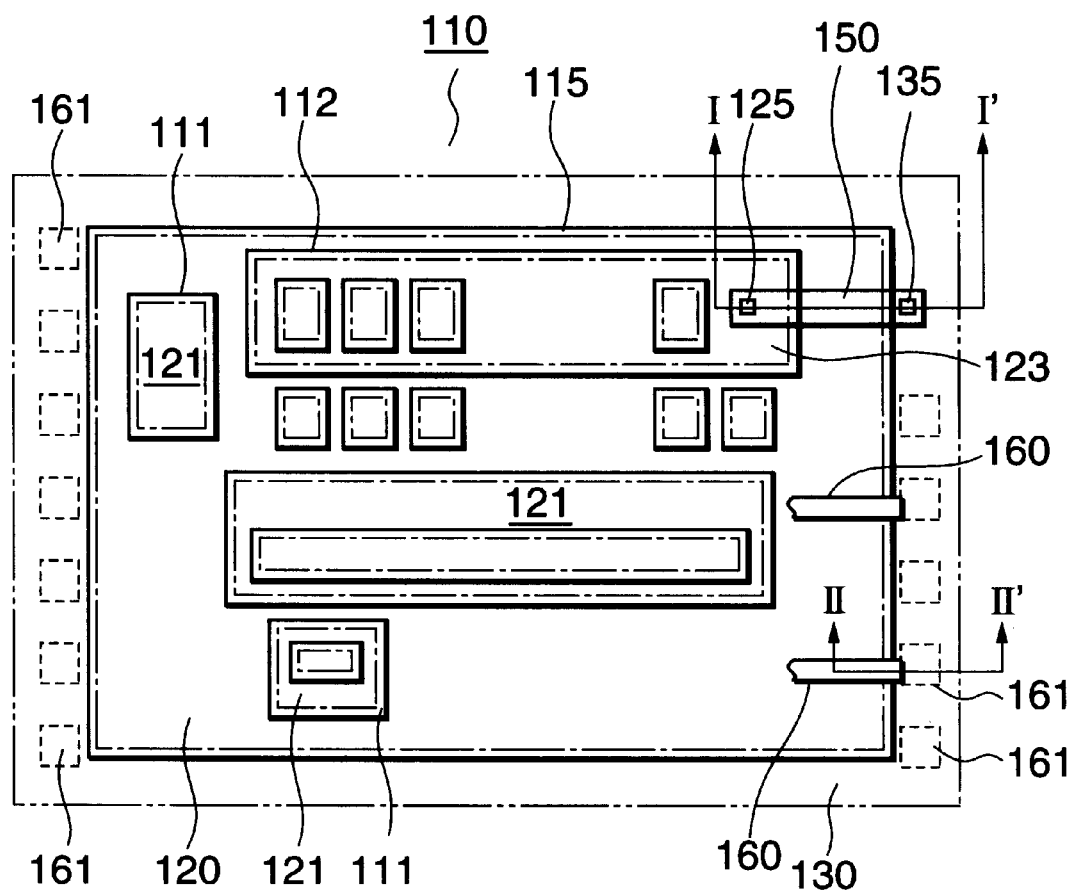
FIG. 9 is a schematic plan view of the entire chip of an illustrative, non-limiting example of a semiconductor device of the present invention.
Figure 10A:
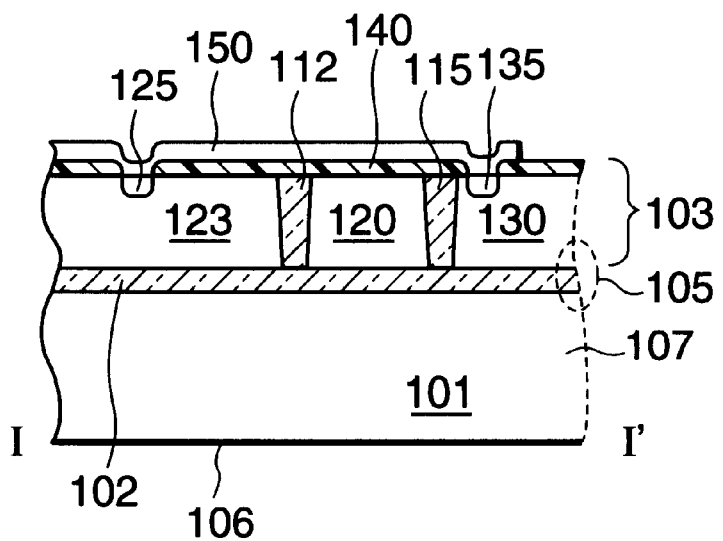
FIG. 10A is a sectional view taken along the line I–I' of FIG. 9.
Figure 10B:
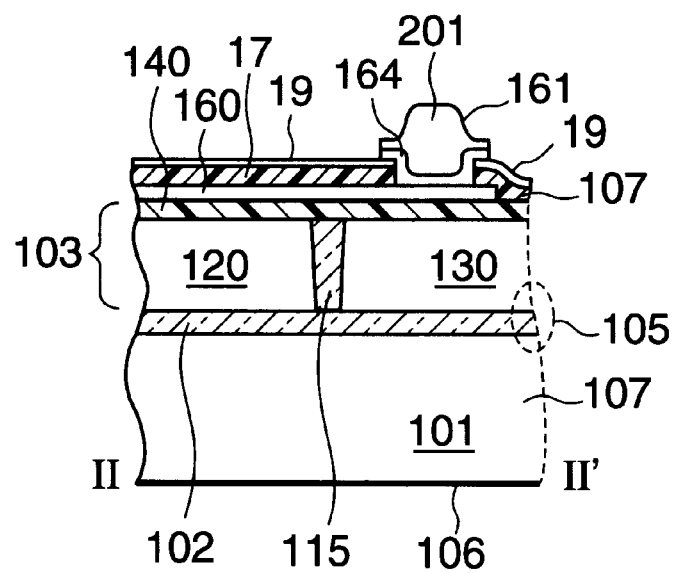
FIG. 10B is a sectional view taken along the line II–II' of FIG. 9.
Figure 11:
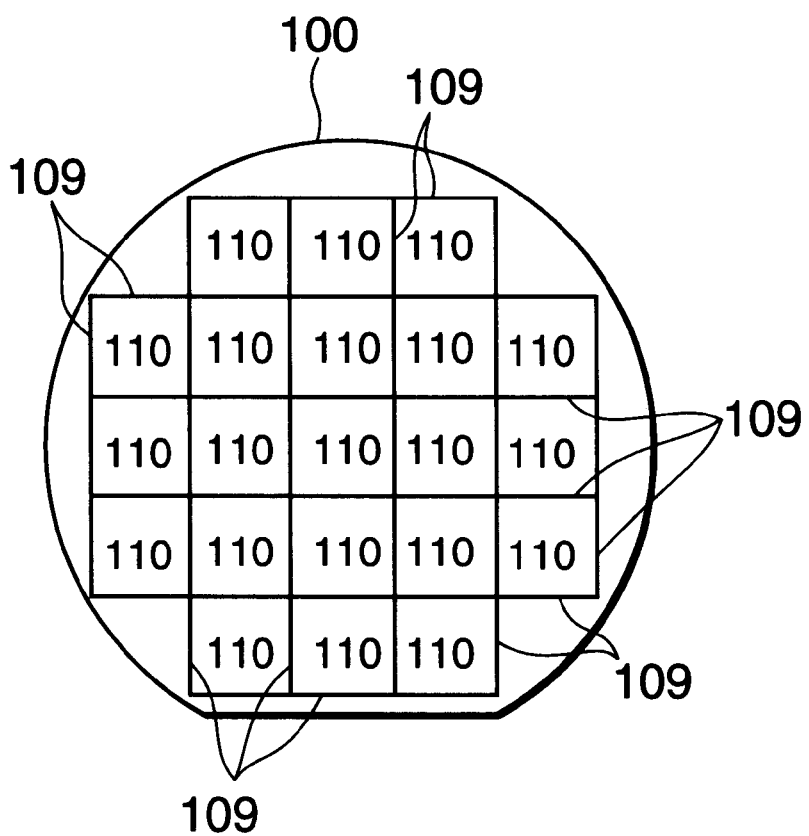
FIG. 11 is a schematic plan view of a wafer in which chips of the semiconductor device of the illustrative, non-limiting example of the present invention are arranged.

FIGS. 9, 10A, and 10B are explanatory views of a first illustrative, non-limiting embodiment of a semiconductor device of the present invention. FIG. 9 is a schematic plan view of the entire chip of the semiconductor device. FIGS. 10A and 10B are schematic cross sectional views taken along the line I–I' and the line II–II' in FIG. 9, respectively. With reference to FIGS. 9, 10A, and 10B, in a chip 110 of this embodiment, on the main surface of a first silicon (Si) substrate 101 of a P-type, which is a conductive support substrate and has a resistivity of, for example, 10 Ω·cm and a thickness of about 650 µm, a silicon oxide film (hereinafter referred to as an $SiO_2$ film) 102 which is an insulating film and has a film thickness of substantially 1 µm and a second Si substrate 103 of a P-type, which is a semiconductor layer and has a resistivity of, for example, 10 Ω·cm and a thickness of about 5 µm are laminated in this order. The chip 110 has, in the second Si substrate 103, isolation trenches 111 and 112, an outermost isolation trench 115, a plurality of element forming regions 120 isolated by these trenches, second element forming regions 121 and 123, a peripheral region 130, and a wiring 150 which connects a contact region 135 of the peripheral region 130 with a contact region 125 connected with a predetermined potential, for example, a ground potential in the second element forming region 123 surrounded by, for example, the isolation trench 112 and formed on a field insulating film 140. Note that, although not shown in the figures, all elements required in this semiconductor device are formed in at least the element forming region 120 and the second element forming regions 121 and 123, which are surrounded by the outermost isolation trench 115, also, these elements are connected with one another by using a known wiring technique. An element to which a high voltage is applied is provided in the second element forming region if possible. Conductivity type of the element forming region 121 and the second element forming regions 121 and 123 are changed in accordance with a desired element by ion implantation or the like. However, at least the peripheral region 130 becomes a P-type. As schematically shown in FIG. 11, the chips 110 are arranged and manufactured on a wafer 100 with an arrangement state and then cut along scribe lines 109 by dicing and separated into individual items after the wafer processing step is completed.

Figure 16A:
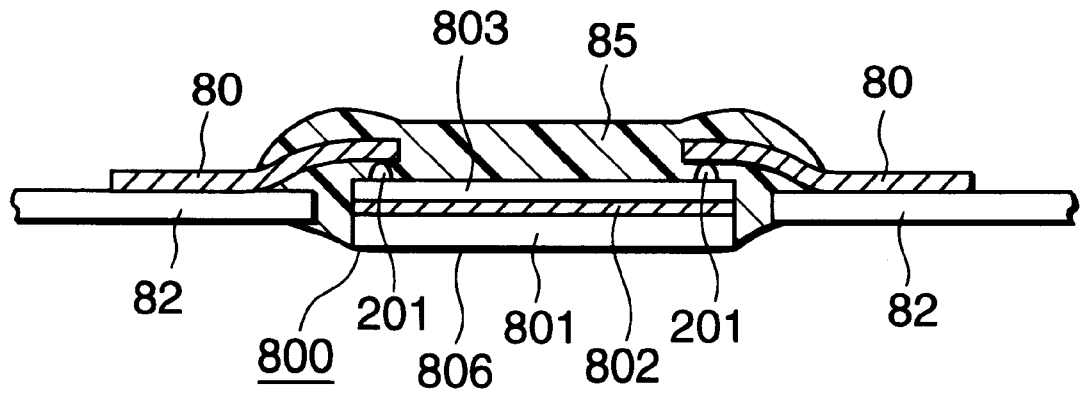
FIG. 16A is a cross sectional view of an illustrative, non-limiting example of the present invention of an assembly state of the chip using an SOI substrate in the case of a TCP mounting.
Figure 16B:
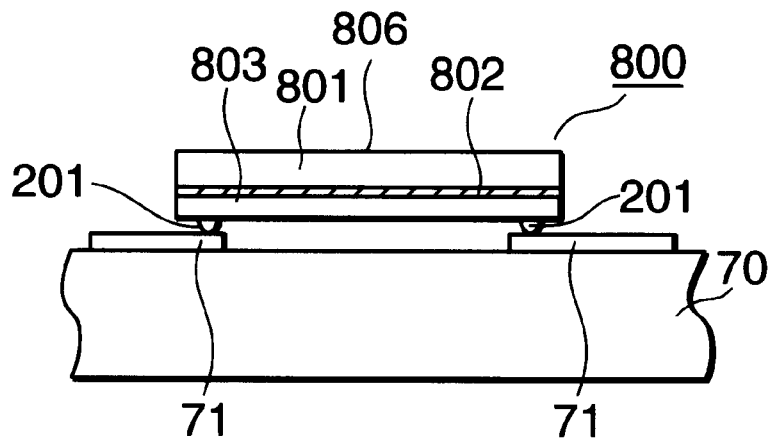
FIG. 16B is a cross sectional view of an illustrative, non-limiting example of the present invention of an assembly state of the chip using an SOI substrate in the case of a flip chip assembly on an assembly substrate.

When the chips 110 are separated into individual items by dicing, an electrical continuity path (not shown) is formed in an $SiO_2$ film potion 105 of a side end surface 107 of the chip 110 and thus a current path is formed between the peripheral region 130 of the second Si substrate 103 and the first Si substrate 101. Therefore, when the peripheral region 130 and the first Si substrate 101 are set to be the same conductivity type, even if a rear surface 106 of the first Si substrate 101 is not connected with another conductor, the first Si substrate 101 becomes the same potential as the peripheral region 130. As described above, the peripheral region 130 of the chip 110 of this embodiment is electrically isolated from all element forming regions including the element forming region 120 and the second element forming regions 121 and 123 by the outermost isolation trench 115, and thus can be connected with the electrode having an arbitrary potential on the chip 110 through the wiring 150 without influences on elements and the element forming regions. Thus, as shown in FIG. 16A, even when the chip is mounted in, for example, TCP assembled with a state such as the rear surface of the chip is not connected with another conductive material, or as shown in FIG. 16B, even when the chip is flip-chip-assembled in an assembly substrate 70 through a bump electrode 201 by face down, if the chip 110 of this embodiment is used instead of the conventional chip 800, an arbitrary predetermined potential selected from potentials on the chip 110 can be supplied to the first Si substrate 101 through the peripheral region 130 and a reduction in a breakdown voltage of an element formed in the second Si substrate 103 can be prevented.

Next, a summary of a method of manufacturing a semiconductor device according to one illustrative, non-limiting embodiment of the present invention, including a method of manufacturing the chip 110 having the above structure will be described.

The method of manufacturing a semiconductor device according to an illustrative, non-limiting embodiment is constructed by including a first operation of preparing an SOI wafer in which one conductivity type semiconductor layer is formed on one conductivity type semiconductor support substrate through an insulating layer, a second operation of opening an isolation trench which reaches the insulating layer and filling the isolation trench with a predetermined insulating material to set a plurality of element forming region, a third operation of forming a desired element in the plurality of element forming region set by the isolation trench, a fourth operation of forming a chip interconnection wiring, in each of a plurality of chips arranged with an arrangement state on the wafer through a scribe region, including a peripheral region connection wiring connected with an electrode having a predetermined potential in the element forming region through a contact hole provided in a predetermined position in a peripheral region outside an outermost isolation trench surrounding all of a plurality of element forming regions included in one chip, a wafer processing operation including the first operation to the fourth operation, and a fifth operation of dicing the scribe region to separate the plurality of chips into individual items.

Figure 12:
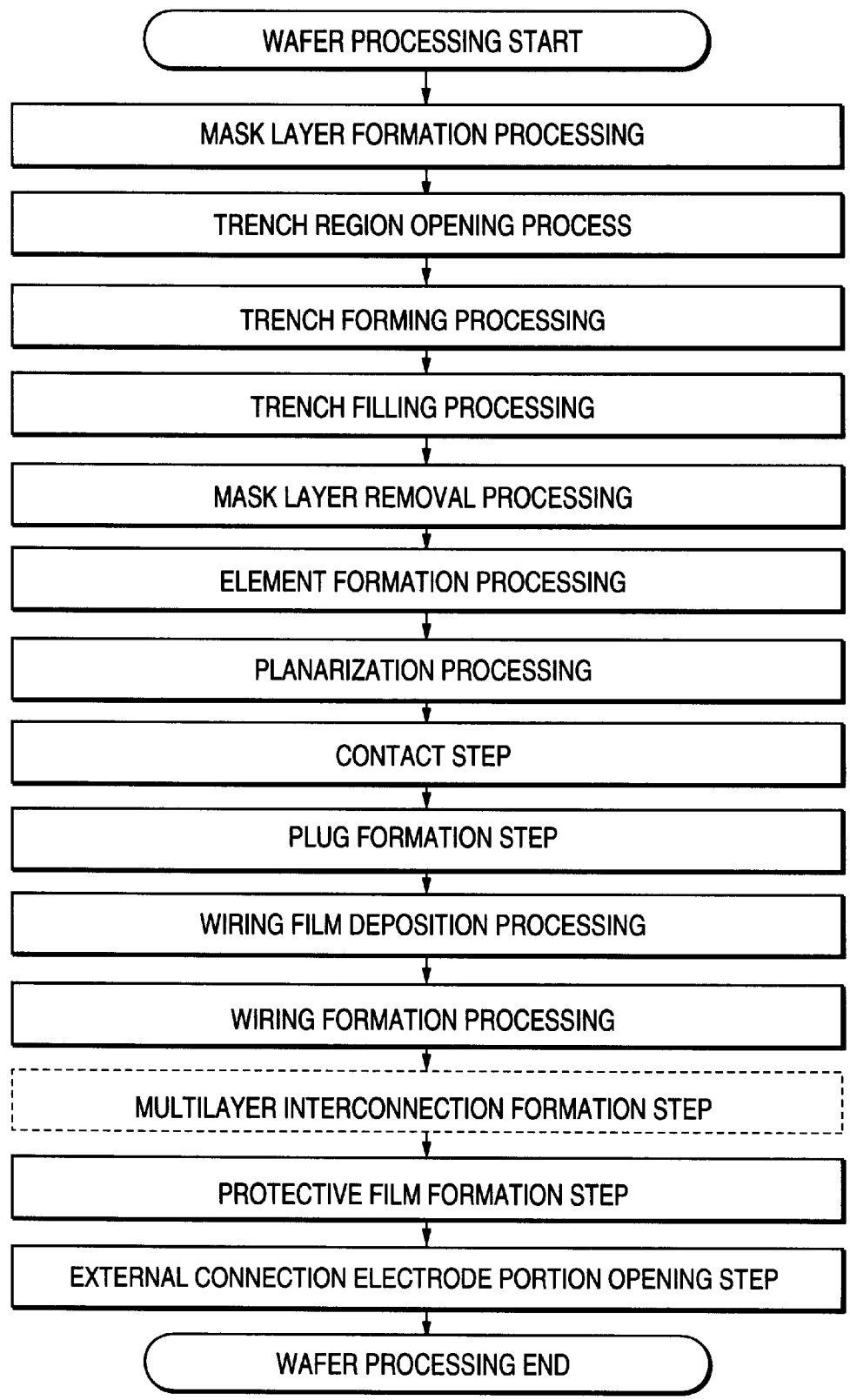
FIG. 12 is a flow chart showing an illustrative, non-limiting example of a method of manufacturing the chip of the semiconductor device of the present invention.
Figure 13:
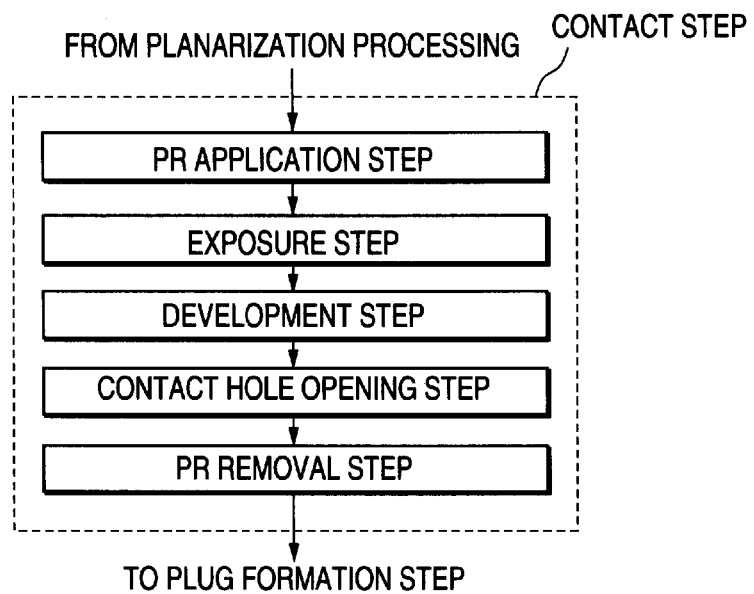
FIG. 13 is a flow chart showing a detail of a portion of the flow chart in FIG. 12.
Figure 14:
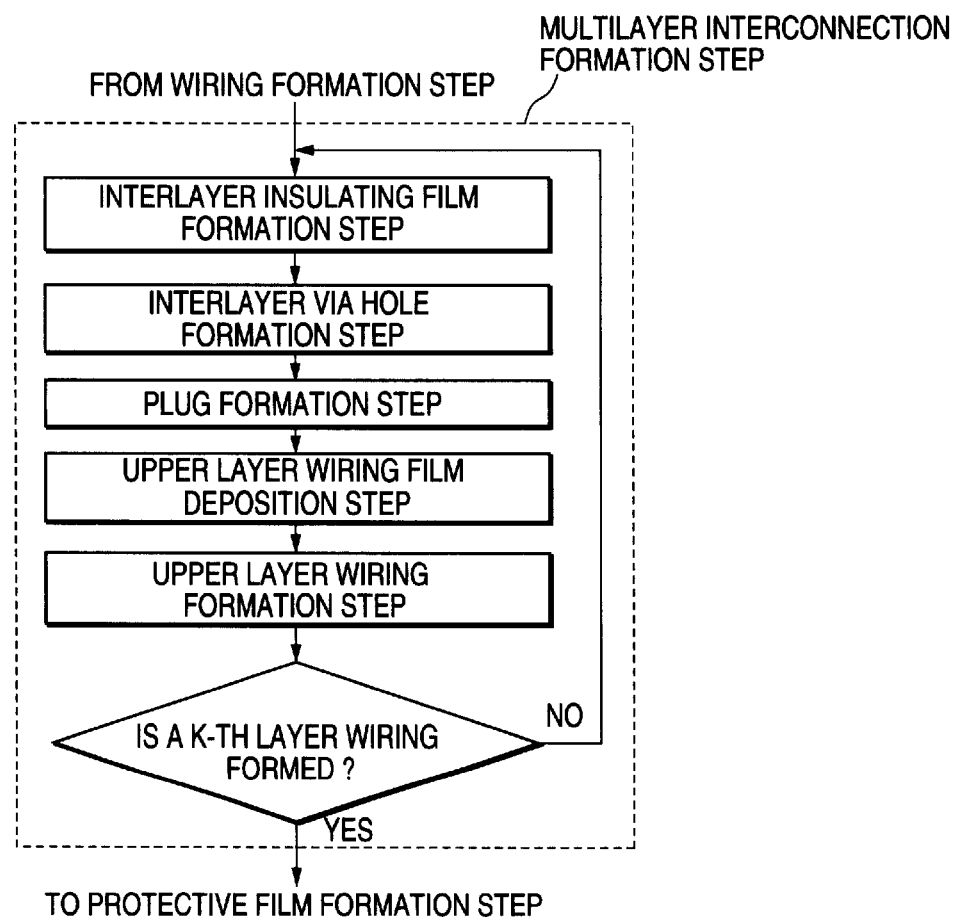
FIG. 14 is a flow chart showing a detail of a portion of the flow chart in FIG. 12.
Figure 15A:
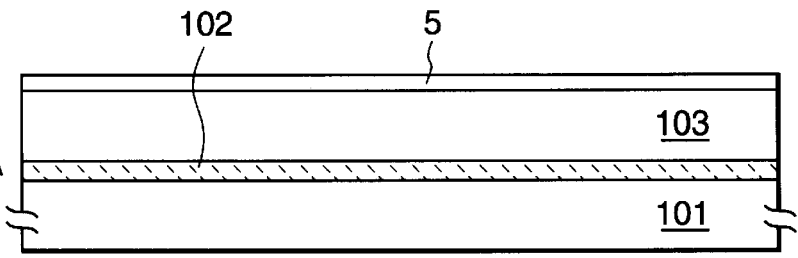
FIG. 15A is a cross sectional view of an illustrative, non-limiting example of the method of manufacturing the chip of the semiconductor device of the present invention, the cross sectional view corresponding to a cross sectional view taken along the line I–I' in FIG. 9.

First, a method of manufacturing the chip 110 will be described. FIGS. 12, 13, and 14 are flow charts showing one non-limiting example of a method of manufacturing the chip 110. FIGS. 15A to 15O are explanatory views of a method of manufacturing the chip in accordance with the flow charts shown in FIGS. 12 to 14 and cross sectional views for each step schematically showing main cross sections taken along the line I–I' in FIG. 9.

With reference to FIGS. 15A to 15O, in a first operation as shown in FIG. 15A, a wafer 100 having a diameter of 6 inches is prepared. In the wafer, an SiO$_2$ film 102 having a film thickness of substantially 1 $\mu$m and a second Si substrate 103 of a P-type, which has a resistivity of substantially 10 $\Omega$·cm and a thickness of about 5 $\mu$m are laminated in this order on one main surface of a first Si substrate 101 of a P-type, which has a resistivity of substantially 10 $\Omega$·cm and a thickness of about 650 $\mu$m. Mask layer forming processing is performed such that an SiO$_2$ film 5 is deposited at a thickness of substantially 0.5 $\mu$m on the entire surface of the wafer 100 by a chemical vapor deposition method (hereinafter referred to as a CVD).

Figure 15B:
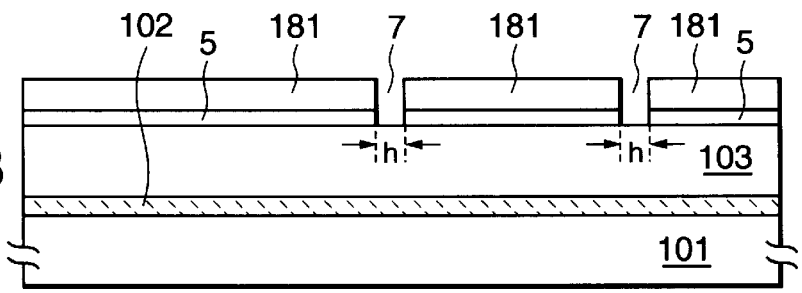
FIG. 15B is a cross sectional view of an illustrative, non-limiting example of the method of manufacturing the chip of the semiconductor device of the present invention, the cross sectional view corresponding to a cross sectional view taken along the line I–I' in FIG. 9.
Figure 15C:
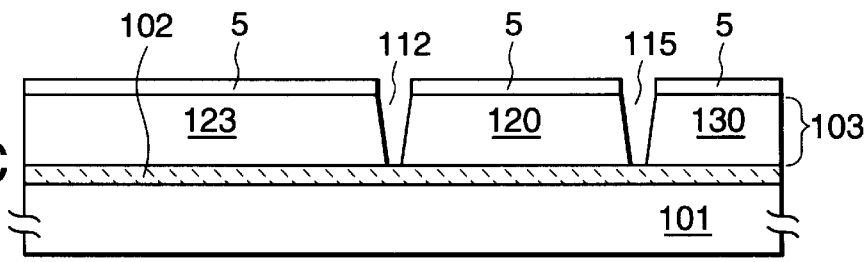
FIG. 15C is a cross sectional view of an illustrative, non-limiting example of the method of manufacturing the chip of the semiconductor device of the present invention, the cross sectional view corresponding to a cross sectional view taken along the line I–I' in FIG. 9.
Figure 15D:
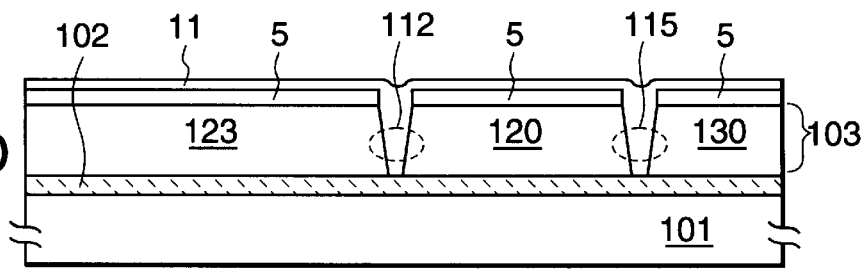
FIG. 15D is a cross sectional view of an illustrative, non-limiting example of the method of manufacturing the chip of the semiconductor device of the present invention, the cross sectional view corresponding to a cross sectional view taken along the line I–I' in FIG. 9.
Figure 15E:
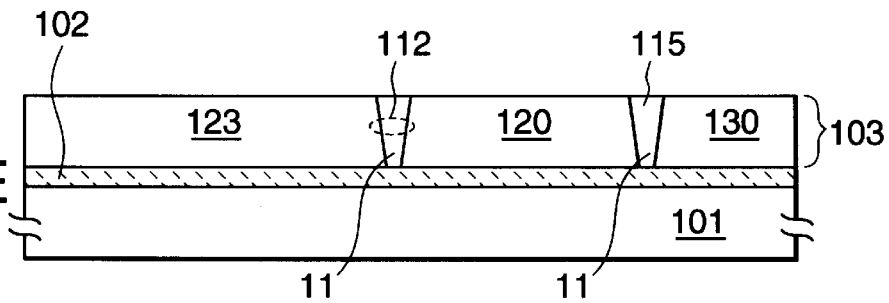
FIG. 15E is a cross sectional view of an illustrative, non-limiting example of the method of manufacturing the chip of the semiconductor device of the present invention, the cross sectional view corresponding to a cross sectional view taken along the line I–I' in FIG. 9.

Next, in a second operation as shown in FIG. 15B, a photo resist (hereinafter referred to as a PR) 181 is applied onto the entire surface of the wafer 100 exposed and developed using a predetermined reticle (not shown) to form, for example, a pattern of an isolation trench formation openings 7 with a width h for isolating the element forming region 120, the second element forming regions 121 and 123, and the peripheral region 130. Further, isolation trench formation region opening processing is performed such that the SiO$_2$ film 5 in the openings 7 is removed using a known etching technique to expose a second Si substrate 2. Next, as shown in FIG. 15C, after the PR 181 is removed, trench forming processing is performed such that an exposed portion of the second Si substrate 103 is removed using the SiO$_2$ film 5 as an etching mask by an anisotropy etching technique to expose the SiO$_2$ film 102 and to form the outermost isolation trench 115 and the isolation trench 112. Thus, all element forming regions including the element forming region 120 and the second element forming region 123 and the peripheral region 130 are isolated from one another. At this time, side wall portions of the isolation trenches 112 and 115 are slightly slanted such that the upper end portion of the opening in a surface side is larger than the bottom portion in which the SiO$_2$ film 102 is exposed. Next, as shown in FIG. 15D, trench filling processing is performed such that by a low pressure chemical vapor deposition (LPCVD) method using a tetra ethoxy silane (hereinafter referred to as a TEOS) gas, a TEOS oxide film 11 as an insulating material is deposited on the entire surface of the wafer 100 to completely fill the isolation trenches 112 and 115. Next, as shown in FIG. 15E, mask layer removing processing is performed such that the TEOS oxide film 11 and the SiO$_2$ films, which are deposited on the surface of the wafer 100 are etched back with the entire surface to expose all element forming regions including the element forming region 120 and the second element forming region 123 and the second Si substrate 103 of the peripheral region 130.

Figure 15F:
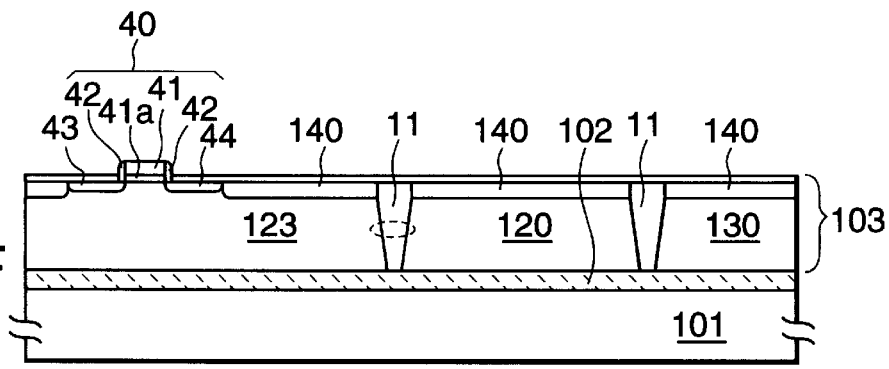
FIG. 15F is a cross sectional view of an illustrative, non-limiting example of the method of manufacturing the chip of the semiconductor device of the present invention, the cross sectional view corresponding to a cross sectional view taken along the line I–I' in FIG. 9.
Figure 15G:
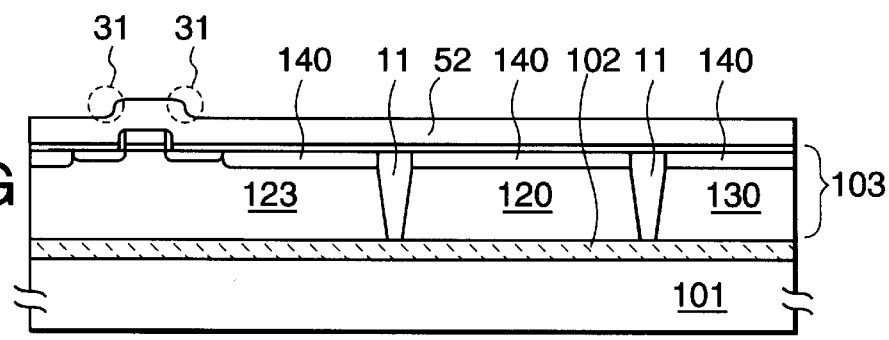
FIG. 15G is a cross sectional view of an illustrative, non-limiting example of the method of manufacturing the chip of the semiconductor device of the present invention, the cross sectional view corresponding to a cross sectional view taken along the line I–I' in FIG. 9.
Figure 15H:
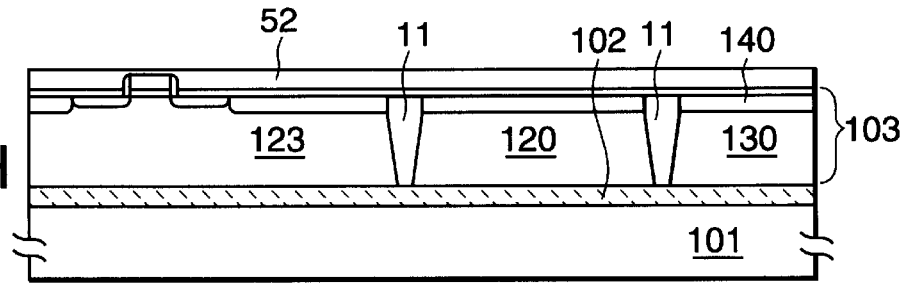
FIG. 15H is a cross sectional view of an illustrative, non-limiting example of the method of manufacturing the chip of the semiconductor device of the present invention, the cross sectional view corresponding to a cross sectional view taken along the line I–I' in FIG. 9.

Next, in a third operation as shown in FIG. 15F, the field insulating film 140 and a desired element are formed by a known method. Here, only a field effect transistor 40 having diffusion regions 43 and 44 as a source and a drain, a side wall oxide film 42, a gate oxide film 41a, and a gate electrode 41 is shown as one example. Next, as shown in FIG. 15G, after for example, an SiO$_2$ film 52 is deposited at a thickness of about 1.5 $\mu$m on the surface of the wafer 100 by a CVD method, planarization processing is performed such that the SiO$_2$ film 52 is etched back with the entire surface to decrease steps 31 caused in, for example, the second element forming region 123, as shown in FIG. 15H.

Figure 15I:
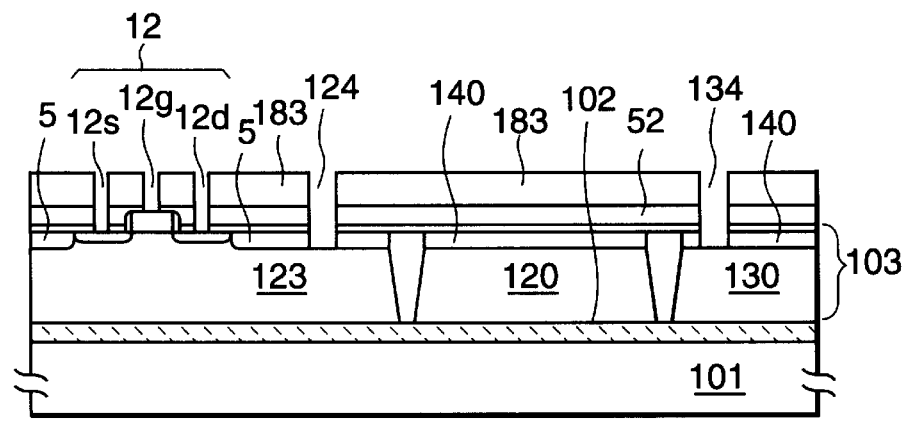
FIG. 15I is a cross sectional view of an illustrative, non-limiting example of the method of manufacturing the chip of the semiconductor device of the present invention, the cross sectional view corresponding to a cross sectional view taken along the line I–I' in FIG. 9.

Next, a contact operation is performed. Concretely, for example, one example of a detail flow is shown in FIG. 13. In a PR application operation, a PR 183 is applied onto the entire surface of the wafer 100. In an exposure operation, exposure is performed using a reticle (not shown) with a predetermined contact hole pattern including contact holes 12s, 12d, 12g (hereinafter represented by 12) and 124 and a contact hole 134 for peripheral region connection. In a development operation, patterns of the contact holes 12, 124, and 134 are developed to form the patterns of the contact holes 12 and 124 connected with a contact region of each element including a common region formed in each element forming region including the element forming region 120 and the second element forming region 123, and the contact hole 134 connected with the peripheral region 130. In a contact hole opening operation as shown in FIG. 15I, after the SiO$_2$ film 52 and the SiO$_2$ film 5 are removed by etching to open the contact holes 12, 124, and 134, the PR 183 is removed.

Next, if necessary, a predetermined impurity is implanted at a predetermined quantity from the opened respective contact holes 12, 124, and 134 to respective contact regions 14, 125 and 135. When, for example, boron is implanted to form a P-type contact region, it is preferable that an implantation quantity N is obtained with about $10^{14}$ atoms·cm$^{-2} \leq N \leq 10^{15}$ atoms·cm$^{-2}$.

Figure 15J:
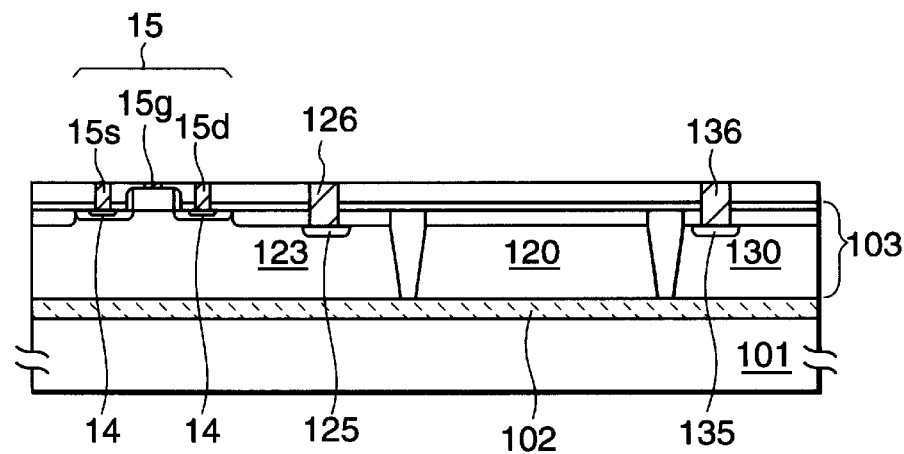
FIG. 15J is a cross sectional view of an illustrative, non-limiting example of the method of manufacturing the chip of the semiconductor device of the present invention, the cross sectional view corresponding to a cross sectional view taken along the line I–I' in FIG. 9.

Next, in a plug formation operation as shown in FIG. 15J, after tungsten is deposited on the entire surface of the wafer 100 by a CVD method to fill the contact holes 12, 124, and 134 with tungsten, the tungsten is etched back with the entire surface to remove tungsten on the SiO$_2$ film 52 in a level portion. Thus, the tungsten 15s, 15d, 15g, 126, and 136 is left as filling metal in the contact holes 12, 124, and 134 and portions of the contact holes 12, 124, and 134 are leveled.

Figure 15K:
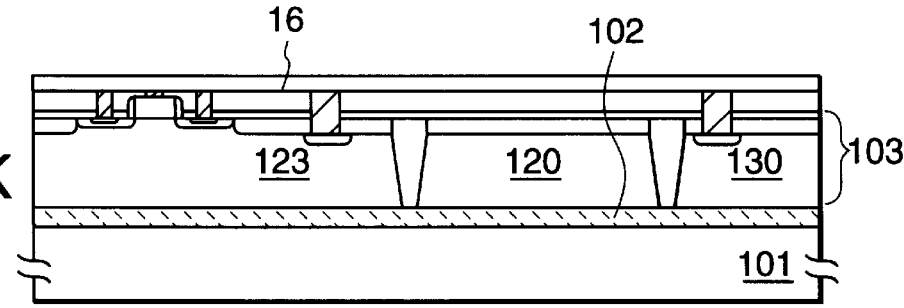
FIG. 15K is a cross sectional view of an illustrative, non-limiting example of the method of manufacturing the chip of the semiconductor device of the present invention, the cross sectional view corresponding to a cross sectional view taken along the line I–I' in FIG. 9.
Figure 15L:
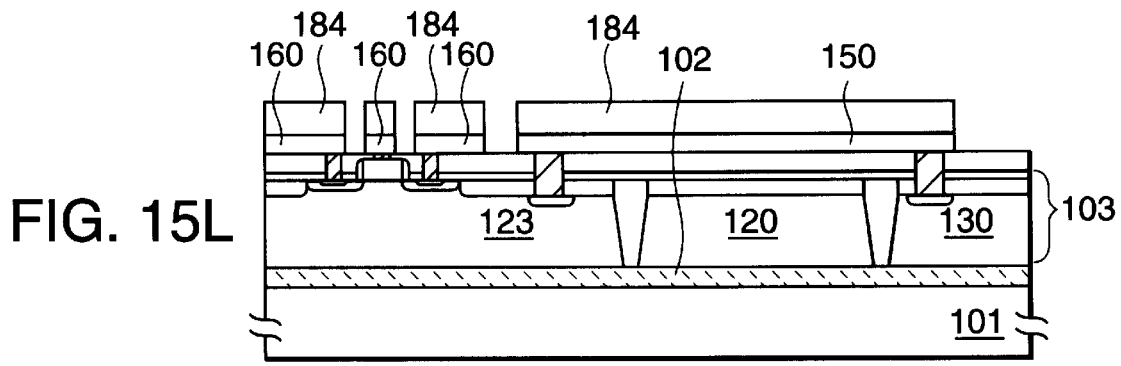
FIG. 15L is a cross sectional view of an illustrative, non-limiting example of the method of manufacturing the chip of the semiconductor device of the present invention, the cross sectional view corresponding to a cross sectional view taken along the line I–I' in FIG. 9.

Next, in a fourth operation as shown in FIG. 15K, wiring film deposition processing is performed such that aluminum (hereinafter referred to as Al) is deposited as a wiring conductive material to have a predetermined thickness on the entire surface of the wafer 100 by a sputtering method to form an Al film 16. Further, as shown in FIG. 15L, wiring formation processing is performed such that a PR 184 is applied onto the entire surface of the wafer 100 and exposed and developed with a reticle (not shown) having a wiring pattern including a predetermined peripheral region connection wiring and then Al except for a wiring portion is removed by, for example, a known dry etching technique to form the peripheral region connection wiring 150 for connecting the contact region 125 as an electrode having a predetermined potential in, for example, the second element forming region 123 with the contact region 135 of the peripheral region 130 and inner connection wirings 160 for connecting between desired elements.

Figure 15M:
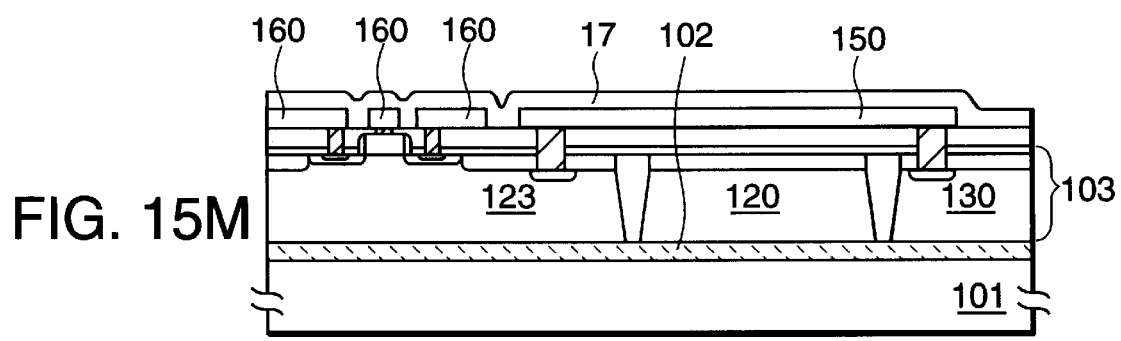
FIG. 15M is a cross sectional view of an illustrative, non-limiting example of the method of manufacturing the chip of the semiconductor device of the present invention, the cross sectional view corresponding to a cross sectional view taken along the line I–I' in FIG. 9.
Figure 15N:
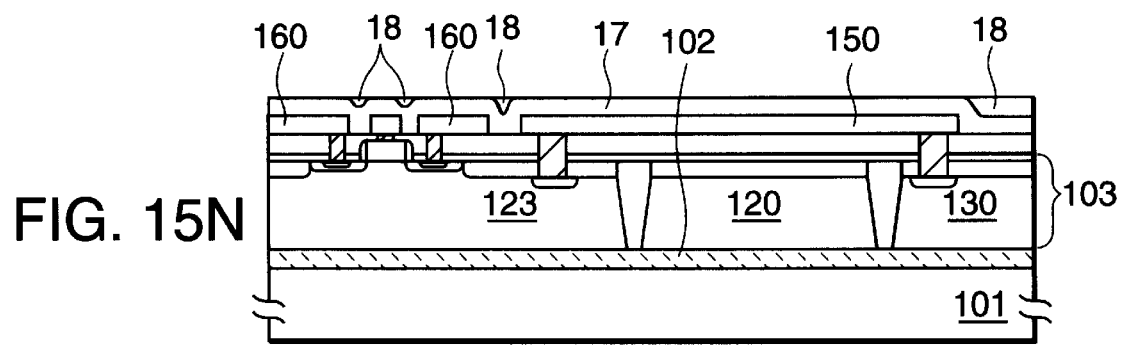
FIG. 15N is a cross sectional view of an illustrative, non-limiting example of the method of manufacturing the chip of the semiconductor device of the present invention, the cross sectional view corresponding to a cross sectional view taken along the line I–I' in FIG. 9.
Figure 15O:
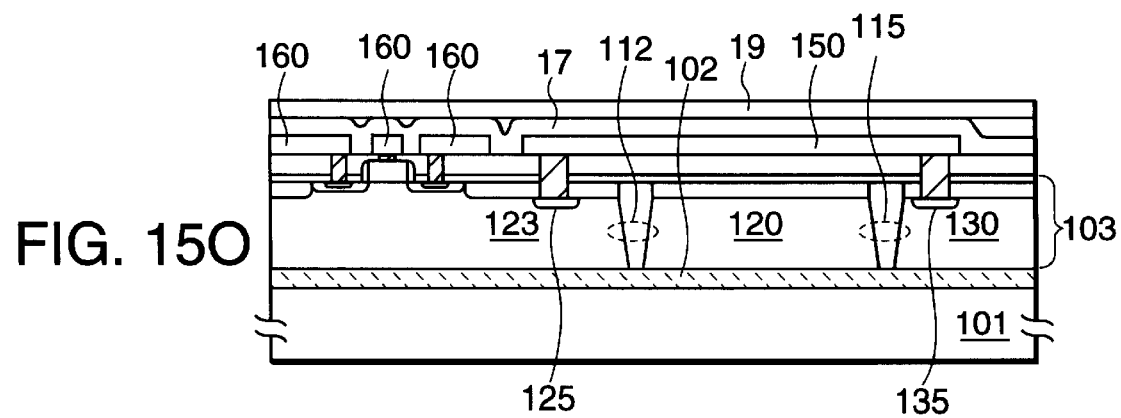
FIG. 15O is a cross sectional view of an illustrative, non-limiting example of the method of manufacturing the chip of the semiconductor device of the present invention, the cross sectional view corresponding to a cross sectional view taken along the line I–I' in FIG. 9.

Next, in a protective film formation operation as shown in FIG. 15M, an $SiO_2$ film for protecting the peripheral region connection wiring 150 and the inner connection wirings 160 is deposited at a thickness t1 (note that it is preferable that $0.3 \mu m \leq t1 \leq 1 \mu m$) on the entire surface of the wafer 100 to form a protective oxide film 17. Subsequently, as shown in FIG. 15N, SOG (spin on glass) 18 is applied thereon and cured by heating. Then, the SOG 18 is etched back with the entire surface until the protective oxide film 17 in the level portion is exposed and thus the unevenness of the surface is reduced. Further, as shown in FIG. 15O, a silicon nitride film ($Si_3N_4$ film) is deposited thereon to have a thickness t2 (note that it is preferable that $0.1 \mu m \leq t2 \leq 0.5 \mu m$) to form a protective nitride film 19. Note that a silicon oxynitride film (SiON film) can be used as the protective nitride film 19. Subsequently, in external connection electrode portion opening step, an external connection electrode portion 161 is opened by using a photolithography technique and an etching technique, which are known, and if necessary, for example, a bump 201 is formed using titanium 164 as underlay metal, as shown in FIG. 10B. Then, the wafer processing operation is completed.

Also, in the case where the chip 110 has a multilayer interconnection structure, after the wiring formation processing, although not shown again, a multilayer interconnection formation step is performed by a known multilayer interconnection manufacturing method. Then, the protective film formation step and the external connection electrode portion opening step are performed to form a protective insulating film which protects an uppermost layer wiring and has a predetermined thickness. After that, the external connection electrode portion 161 is opened and if necessary, the bump 201 is formed. Then, the wafer process is completed. Note that, for example, as shown in FIG. 14, the multi-layer interconnection formation step can be constructed by repeating necessary times (in the case of k layers, (k−1) times), including an interlayer insulating film formation step, an interlayer via hole formation step, a plug formation step for filling a via hole with a metal, an upper layer wiring film deposition step, and an upper layer wiring formation step.

After the above wafer process is completed regardless of a single layer interconnection structure or a multilayer interconnection structure, in a fifth step, a scribe line 109 of the wafer 100 is cut by dicing to separate the chips 110 into individual items and then the chip 110 is mounted on a predetermined package to complete the semiconductor device. Alternatively, a bare chip can be mounted on an assembly substrate without mounting on the package.

For example, it is assumed that the chip 110 manufactured by the above steps is used instead of the chip 800 shown in FIGS. 16A and 16B. In the case of mounting on the TCP, as shown in FIG. 16A, an inner lead 80 which is provided in, for example, a film gate of a polyimide film 82 made in advance of a copper foil or the like is connected with the external connection bump 201 provided in the element forming surface side of the chip 110. Then, the element forming surface of the chip 110 including the external connection bump 201 and the side end surface 107 of the chip 110 are sealed by a sealing resin 85. At this time, the rear surface 106 of the first Si substrate 101 as a conductive support substrate of the chip 110 is not in contact with any conductive materials. Also, in the case of the bare chip assembly shown in FIG. 16B, the chip 110 is connected with an electrode 71 on the assembly substrate 70 through the bump 201 by face down. Even in this case, the rear surface 106 of the first Si substrate is not in contact with any conductive materials. However, as described above, the peripheral region 130 of the chip 110 of this embodiment is electrically isolated from all element forming regions including the element forming region 120 and the second element forming regions 121 and 123 by the outermost isolation trench 115, and thus can be connected with the electrode having an arbitrary potential on the chip 110 through the wiring 150 without influences on elements and the element forming regions. Further, when the chips 110 are separated into individual items by dicing, an electrical continuity path not shown is formed in the $SiO_2$ film potion 105 of the side end surface 107 of the chip 110 and thus a current path is formed between the peripheral region 130 of the second Si substrate 103 and the first Si substrate 101. Also, since the first Si substrate 101 and the peripheral region 130 have a P-type and the same conductivity type, the first Si substrate 101 becomes the same potential as the peripheral region 130. Thus, even if the rear surface 106 of the first Si substrate 101 is not connected with another conductor, an arbitrary predetermined potential selected from potentials on the chip 110 can be supplied through the peripheral region 130 and a reduction in a breakdown voltage of an element formed in the second Si substrate 103 can be prevented.

As described above, in the semiconductor device of the illustrative, non-limiting embodiment, the SOI substrate which is suitable to mount a driver circuit portion with a high voltage in the flat type display device such as the PDP device or the EL device is used as the chip substrate. Also, even if its support substrate is not in contact with another conductor, the peripheral region of the chip is connected with the electrode having an arbitrary predetermined potential in the chip. Thus, since the predetermined potential is supplied to the support substrate through the peripheral region and the side end surface, mounting on a thin type package such as a TCP or a bare chip assembly such as a flip chip assembly is allowed while suppressing characteristic deterioration such as the reduction in the breakdown voltage of the element.

Figure 1A:
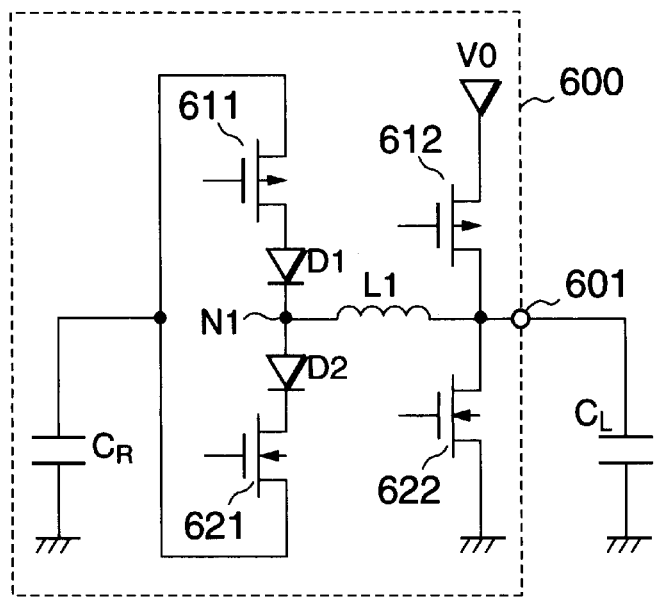
FIG. 1A is a circuit diagram of a low power driver device of a plasma display described in Japanese Patent No. 2770657.
Figure 1B:
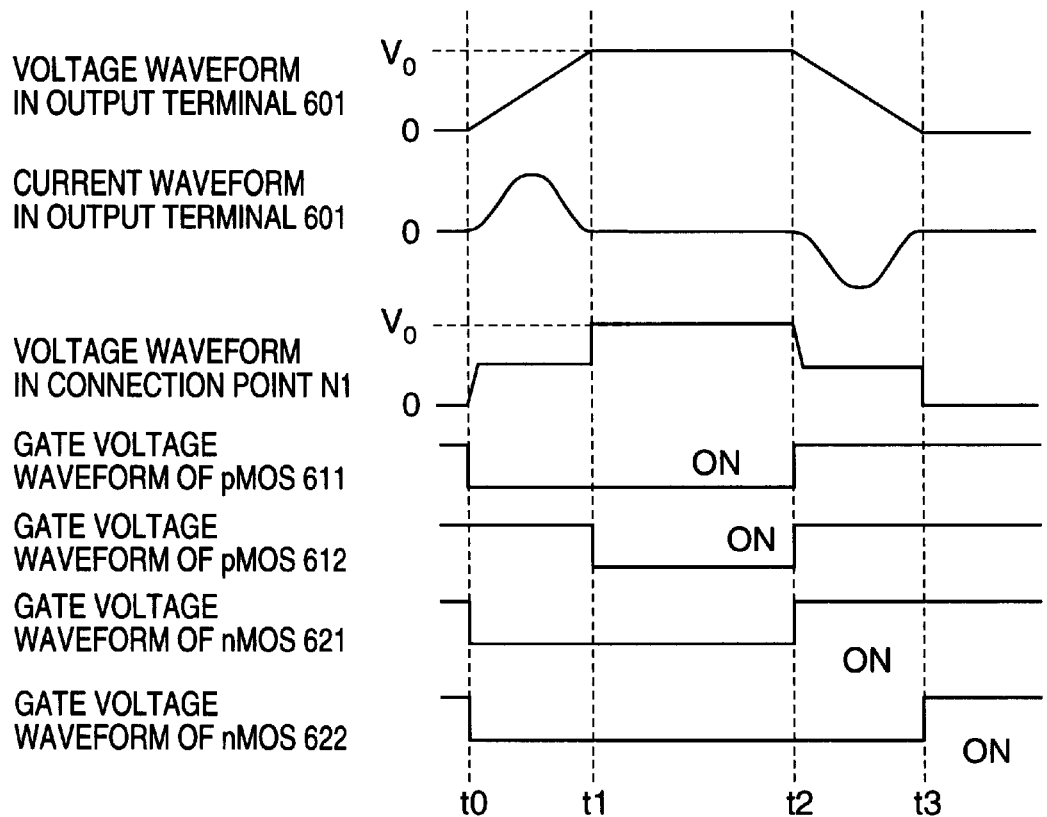
FIG. 1B is a operation waveforms of a low power driver device of a plasma display described in Japanese Patent No. 2770657.
Figure 2:
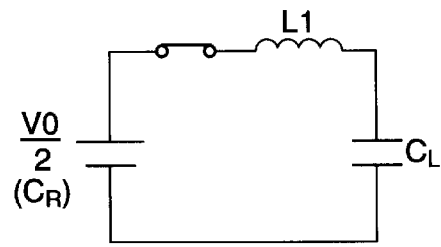
FIG. 2 is an equivalent circuit in the case where the low power driver device of FIG. 1A is operated.
Figure 3:
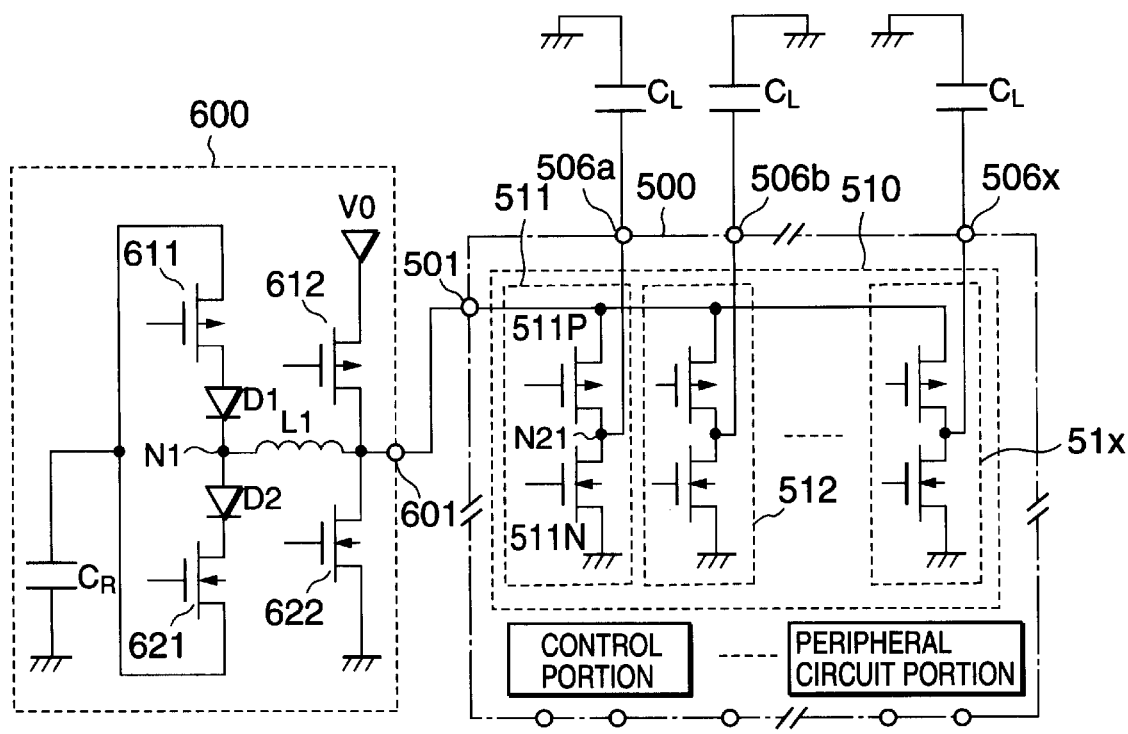
FIG. 3 is an explanatory view of an example in the case where the low power driver device of FIG. 1A is applied to a PDP device.
Figure 4A:
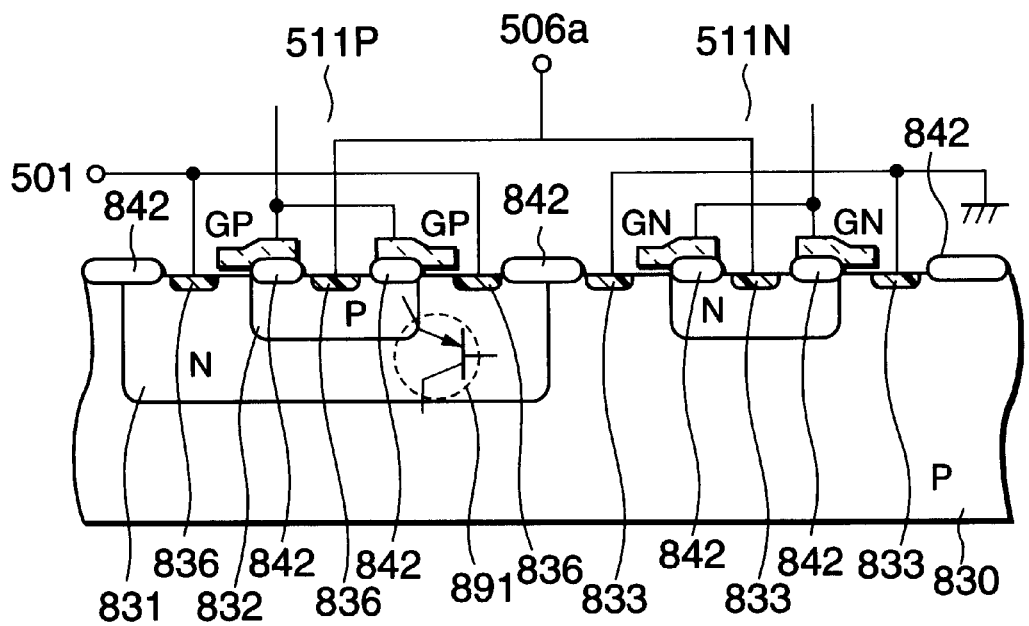
FIG. 4A is a cross sectional views of a parasitic element of an output portion of a driver IC at power recovery operation schematically showing element structures in the case where it is formed on a general silicon substrate with a self isolation structure.
Figure 4B:
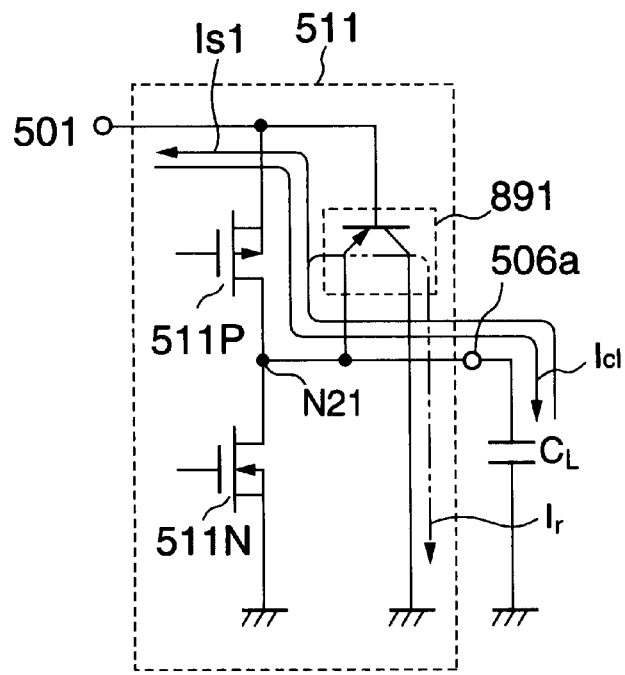
FIG. 4B is an equivalent circuits based on FIG. 4A.
Figure 5A:
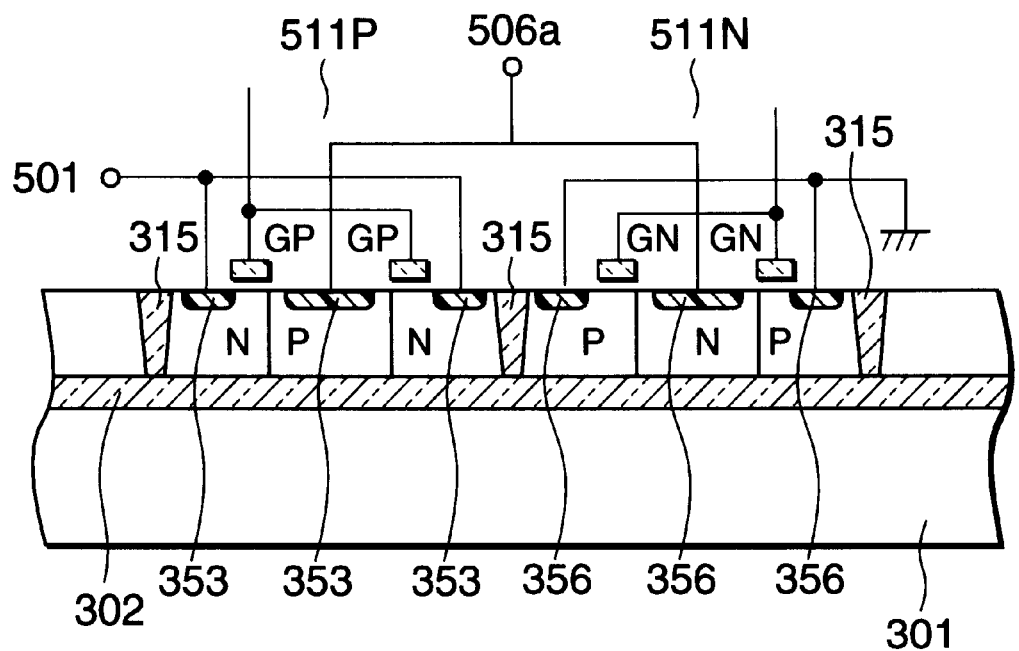
FIG. 5A is a cross sectional views of a parasitic element of an output portion of a driver IC at power recovery operation schematically showing element structures in the case where it is formed on the SOI substrate with a trench isolation structure.
Figure 5B:
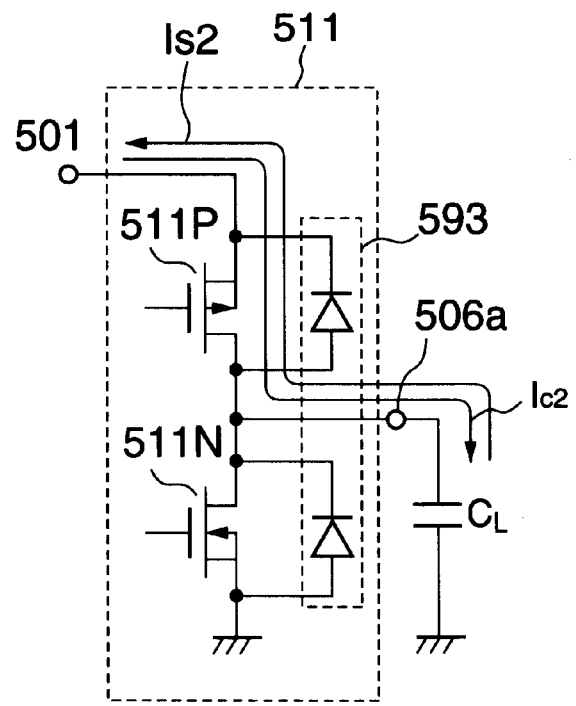
FIG. 5B is an equivalent circuits based on FIG. 5A.
Figure 6:
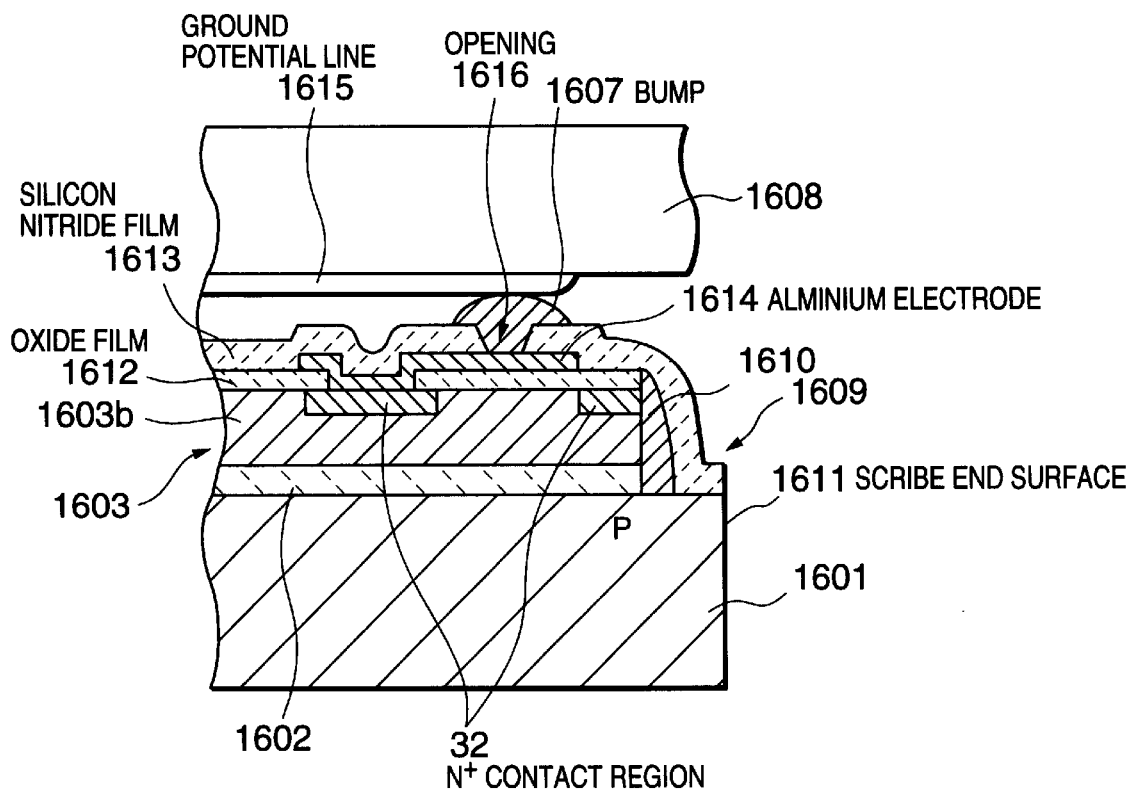
FIG. 6 is a partially cross sectional view enlarging a main portion (vicinity of a scribing end surface) in the case where the flip chip assembly is made for the semiconductor device disclosed in Japanese Patent Application Laid-open No. Hei. 6-244239.
Figure 7:
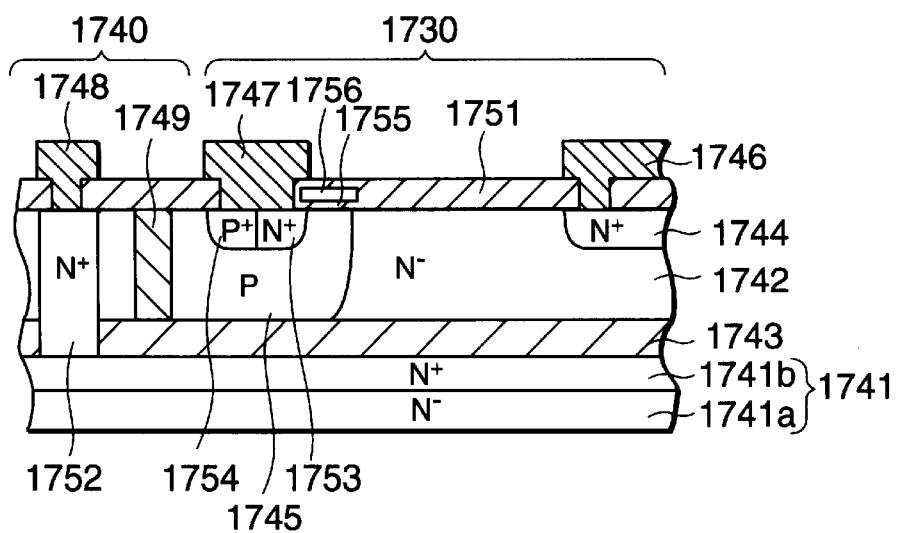
FIG. 7 is a main portion cross sectional view of the semiconductor device disclosed in Japanese Patent Application Laid-open No. Hei. 11-354631.
Figure 8:
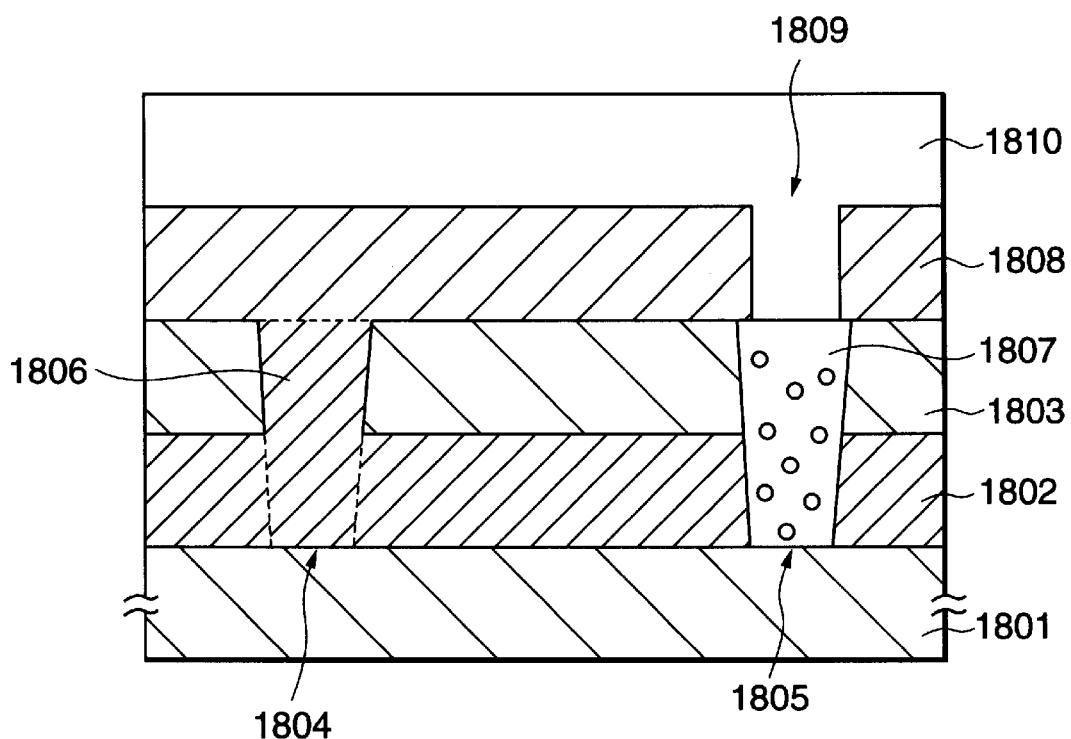
FIG. 8 is a cross sectional structure view of the semiconductor device disclosed in Japanese Patent Application Laid-open No. 2000-156408.
Figure 17A:
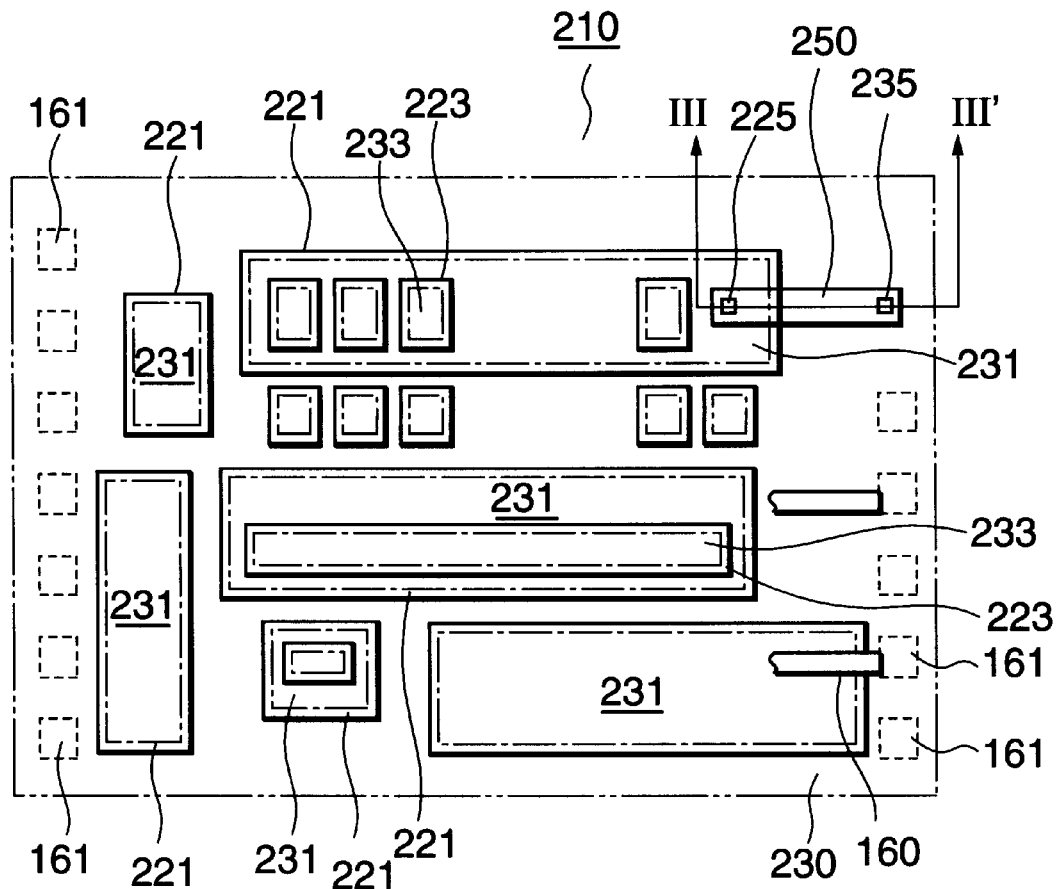
FIG. 17A is a plan view of the entire chip of the semiconductor device of a second illustrative, non-limiting embodiment of the present invention.
Figure 17B:
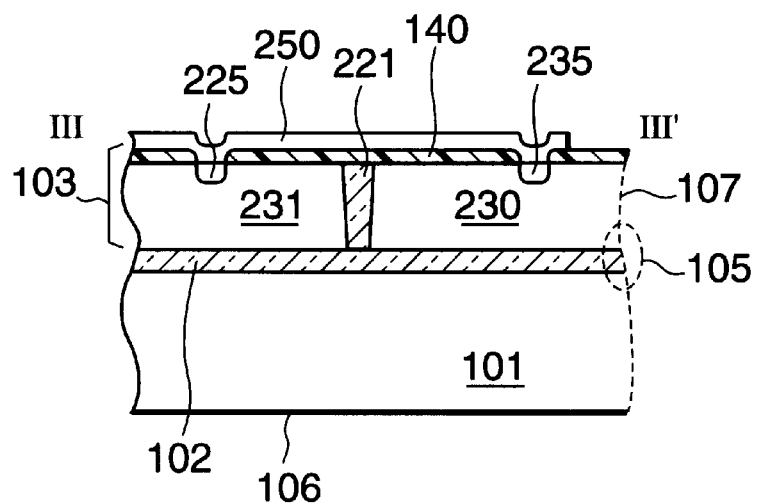
FIG. 17B is a schematic cross sectional view taken along the line III–III' of FIG. 17A.

Note that in the above embodiment, the example of the chip 110 having the outermost isolation trench 115 is described. However, if all element forming regions are surrounded by an isolation trench, the outermost isolation trench 115 may not be provided. FIGS. 17A and 17B are explanatory views in the case where the outermost isolation trench is not located, FIG. 17A is a schematic plan view of the chip without the outermost isolation trench and FIG. 17B is a schematic cross sectional view, taken along the line III–III' in FIG. 17A. Note that a chip 210 without the outermost isolation trench has the same structure in a thickness direction of a chip substrate as the chip 110. Thus, the same constitution elements as the chip 110 are referred to the same reference symbols as FIG. 1 and the description is omitted here. The chip 210 has not the outermost isolation trench. However, all the element forming regions 231 are surrounded by the isolation trenches 221. Further, if necessary, the second element forming region 233 surrounded double by the isolation trenches 221 and 223 is provided. Also, a contact region 235 provided in a predetermined position of the peripheral region 230 which is not surrounded by any isolation trenches 221 and, for example, a contact region 225 as the electrode having a predetermined potential are connected with each other through a peripheral region connection wiring 250. Note that any element forming regions are located such that a chip peripheral portion including a chip side edge portion necessarily becomes the peripheral region 230. Also, since the chips are separated into individual items by dicing, as the case of the chip 110, the predetermined potential is supplied to the first Si substrate 101 through the peripheral region 230 and the chip side end portion 107. Thus, the detail description is omitted here. Further, since a chip manufacturing method is similar to the method of manufacturing the chip 110, the description is omitted here.

Also, the semiconductor device and its manufacturing method according to the present invention are not limited to the description of the above illustrative, non-limiting embodiment, and various modifications may be naturally made in the scope not departing from the gist of the present invention. For example, in the case where a Si substrate is used as the conductive support substrate 101, when the resistivity is 1 to 50 Ω·cm and a thickness is 600 to 700 μm, the conductivity type may be either a P-type or an N-type. Also, even in the case where the Si substrate is not used, if a substrate has conductivity and does not cause a problem in manufacturing steps, such a substrate can be used by selecting a suitable material. It is desirable that silicon with a single crystalline layer having a resistivity of 10 to 20 Ω·cm and a thickness of 2 to 10 μm, is used as the semiconductor layer. However, it is not limited to this. When the Si substrate is used as at least the conductive support substrate, it is preferable that an $SiO_2$ film having a film thickness of 0.5 μm to 2 μm is used as the first insulating film. Also, in the plug formation operation, tungsten is shown as an example of a filling metal. However, when a high temperature sputtering method in the case where a substrate temperature is set to be about 500° C. is used, Al can be used as the filling metal. Further, in the case where a size of respective contact holes 12, 124, and 134 is sufficiently large, the plug formation operation can be omitted. The metal for forming the wiring 16 is not limited to the above Al, and aluminum containing silicon (AlSi), aluminum containing copper (AlCu), aluminum containing copper and silicon (AlSiCu), or the like can be used.

Also, in the above embodiment, the example is described such that, first, the second step including trench region opening processing and trench formation processing is performed to form the isolation trench 112 and the outermost isolation trench 115 and then the third step is performed to form a desired element. However, the process is allowed such that, first, the third step is performed to form a desired element in an element forming region 50 and then the second step is performed to form the isolation trenches 112 and 115.

As described above, according to the semiconductor device and its manufacturing method of illustrative, non-limiting embodiments, even when the SOI substrate which is suitable for a high breakdown voltage and a high voltage is used as the chip substrate, it is not required that the rear surface of the chip does not contact with another conductor, and mounting on a thin type package including a TCP is allowed, and thus a thin type high breakdown voltage semiconductor device can be realized. Also, an effect is obtained such that it can be supported for a face down assembly such as a flip chip assembly with a bare chip without mounting on the package.

Further, from the above, a TCP or a bare chip assembly can be applied to a device with a high voltage, in which a semiconductor device using the SOI substrate as the chip substrate is used in many cases and thus the miniaturization and the thinness of the device can be made. In particular, a remarkable effect is obtained for the miniaturization and the thinness of the display device such as the PDP device or the EL device, which is used as a driver circuit of a display portion in many cases.

The present invention is not limited to the above embodiments, and it is contemplated that numerous modifications may be made without departing from the spirit and scope of the invention. The semiconductor device, as described above with reference to the figures, is a merely an exemplary embodiment of the invention, and the scope of the invention is not limited to these particular embodiments. Accordingly, other structural configurations may be used, without departing from the spirit and scope of the invention as defined in the claims.

What is claimed:

1. A semiconductor device comprising a semiconductor chip having a peripheral edge that is defined by a scribe line along which said semiconductor chip is separated from a semiconductor wafer, said semiconductor chip including:
   a semiconductor substrate and a semiconductor layer formed over said semiconductor substrate with an insulating layer sandwiched therebetween, said semiconductor layer including an element region and a peripheral region that is electrically isolated from said element region, said element region including a plurality of elements, said peripheral region including said peripheral edge; and
   a contact provided to supply said peripheral region with a potential, said potential being transferred to said semiconductor substrate through a portion of said insulating layer exposed by said scribe line.

2. The semiconductor device as claimed in claim 1, wherein said element region and said peripheral region are electrically isolated by a trench.

3. The semiconductor device as claimed in claim 1, wherein said elements are divided into at least two groups, and said two groups are surrounded by an isolating trench.

4. The semiconductor device as claimed in claim 1, wherein said semiconductor substrate and said peripheral region are equal in conductive type to each other.

5. The semiconductor device as claimed in claim 1, wherein said semiconductor substrate is in direct contact with a resin.

6. The semiconductor device as claimed in claim 1, further comprising
   a wiring layer formed over said semiconductor layer, said wiring layer being in electrical contact with said element region and with said peripheral region.

* * * * *